US008867234B2

(12) United States Patent
Heimann et al.

(10) Patent No.: US 8,867,234 B2
(45) Date of Patent: *Oct. 21, 2014

(54) PROTECTIVE TELECOMMUNICATIONS ENCLOSURE SYSTEMS AND METHODS

(75) Inventors: Michael J. Heimann, Auburn, VA (US); Jennifer Edison, Denver, CO (US); Howard Bylund, Great Falls, VA (US); Andrew Bruno, Thornton, CO (US)

(73) Assignee: Qwest Communications International Inc., Denver, CO (US)

( * ) Notice: Subject to any disclaimer, the term of this patent is extended or adjusted under 35 U.S.C. 154(b) by 1306 days.

This patent is subject to a terminal disclaimer.

(21) Appl. No.: 11/780,045

(22) Filed: Jul. 19, 2007

(65) Prior Publication Data
US 2009/0021925 A1    Jan. 22, 2009

(51) Int. Cl.
*H05K 9/00* (2006.01)
*H04Q 1/02* (2006.01)
*H04Q 1/20* (2006.01)
*H04Q 1/06* (2006.01)
*H05K 7/18* (2006.01)

(52) U.S. Cl.
CPC .............. *H05K 9/0062* (2013.01); *H04Q 1/023* (2013.01); *H04Q 1/20* (2013.01); *H04Q 1/025* (2013.01); *H04Q 1/116* (2013.01); *H04Q 1/064* (2013.01); *H04Q 1/03* (2013.01); *H05K 7/186* (2013.01); *H04Q 1/035* (2013.01)
USPC ........... 361/818; 361/826; 361/724; 361/727; 174/520; 379/325; 439/404; 439/620.09; 439/719; 370/352; 370/420; 370/463; 385/88; 385/135

(58) Field of Classification Search
USPC .................. 361/818, 826, 724, 727; 174/520; 379/325; 439/404, 620.09, 719; 370/352, 420, 463; 385/88, 135
See application file for complete search history.

(56) References Cited

U.S. PATENT DOCUMENTS

| | | | |
|---|---|---|---|
| 6,515,224 B1* | 2/2003 | Pedro ............................. | 174/491 |
| 2002/0044525 A1* | 4/2002 | Czerwiec et al. ............. | 370/216 |
| 2002/0162808 A1* | 11/2002 | Jordan ............................ | 211/26 |
| 2004/0076284 A1* | 4/2004 | Baker et al. ................... | 379/325 |
| 2005/0024842 A1* | 2/2005 | Warenczak ................... | 361/826 |
| 2005/0087424 A1* | 4/2005 | Newsome et al. ............ | 194/320 |
| 2005/0128722 A1* | 6/2005 | Miller et al. .................. | 361/797 |
| 2007/0105445 A1* | 5/2007 | Manto et al. ............. | 439/620.09 |

OTHER PUBLICATIONS

U.S. Appl. No. 13/773,939; Notice of Allowance dated Aug. 11, 2014; 16 pages.

* cited by examiner

*Primary Examiner* — Xiaoliang Chen
(74) *Attorney, Agent, or Firm* — Swanson & Bratschun, L.L.C.

(57) ABSTRACT

Protective containers for electronic equipment, and methods of testing and manufacture thereof, are provided. Enclosure systems and methods for protecting telecommunications equipment from electromagnetic fields include cabinets having a maximum width dimension that does not exceed about 26 inches and a maximum depth dimension that does not exceed about 22⅜ inches. The cabinets provide a HEMP protection level to electronic equipment housed therein that meets a HEMP protection level according to MIL-STD-188-125-1.

11 Claims, 36 Drawing Sheets

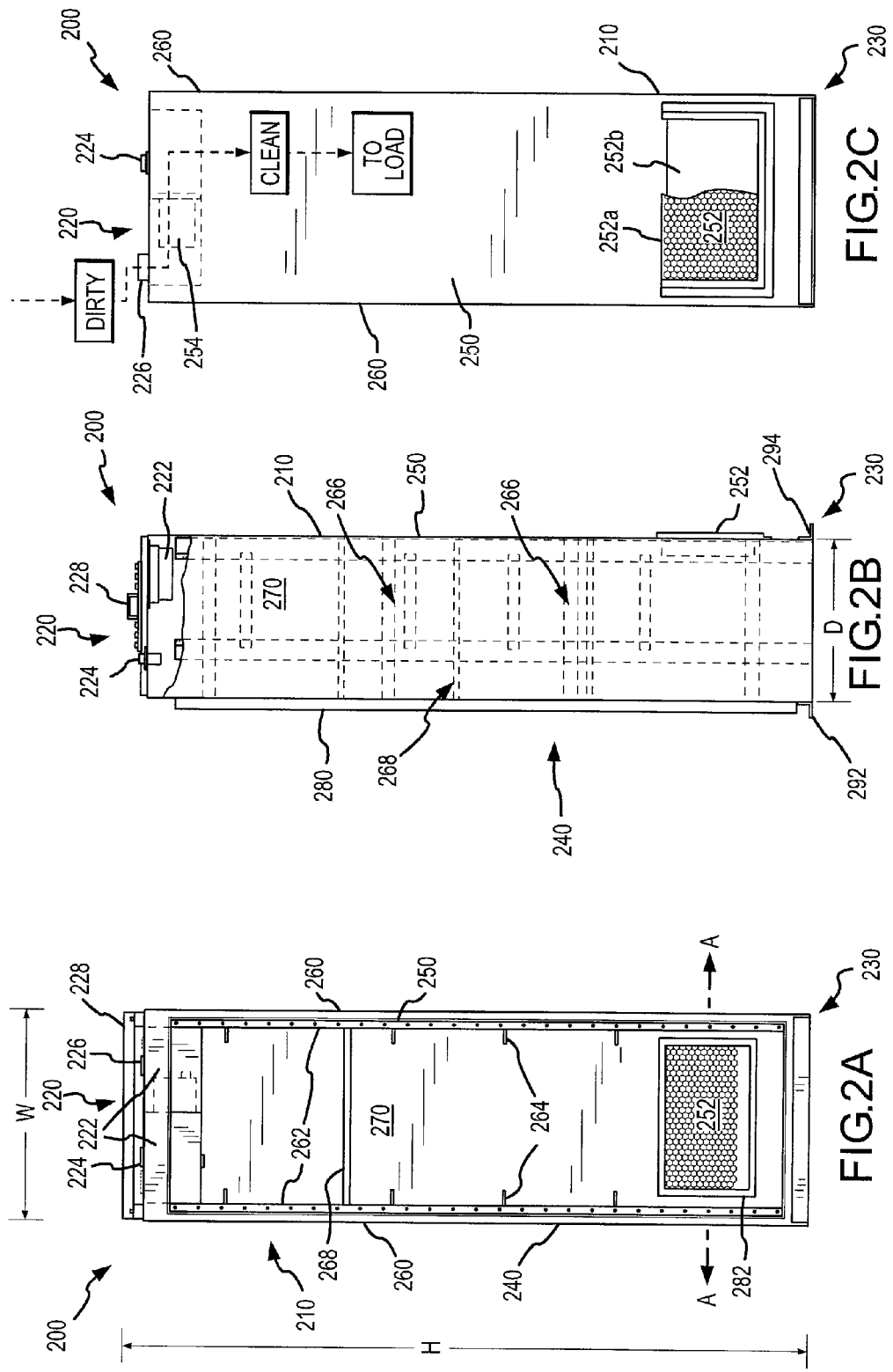

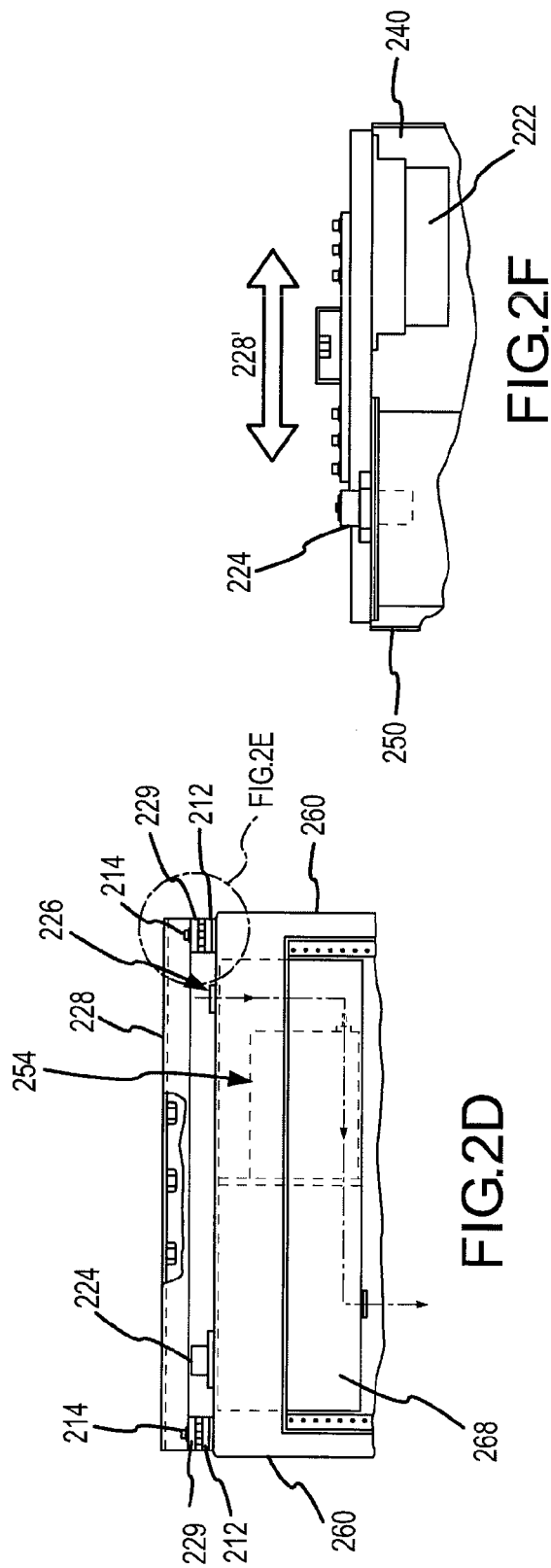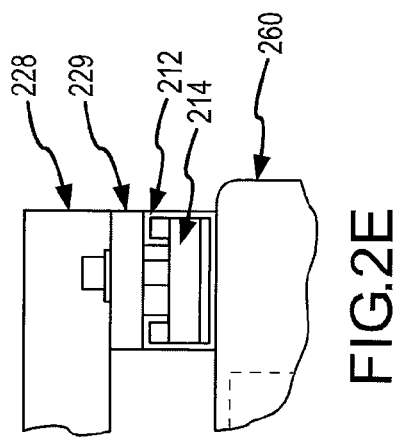

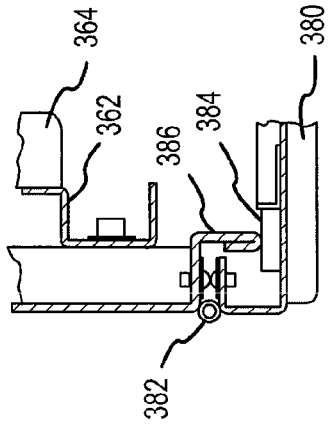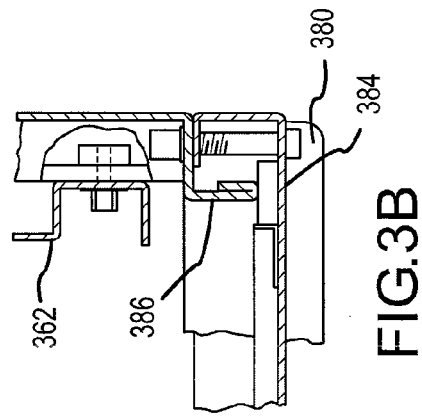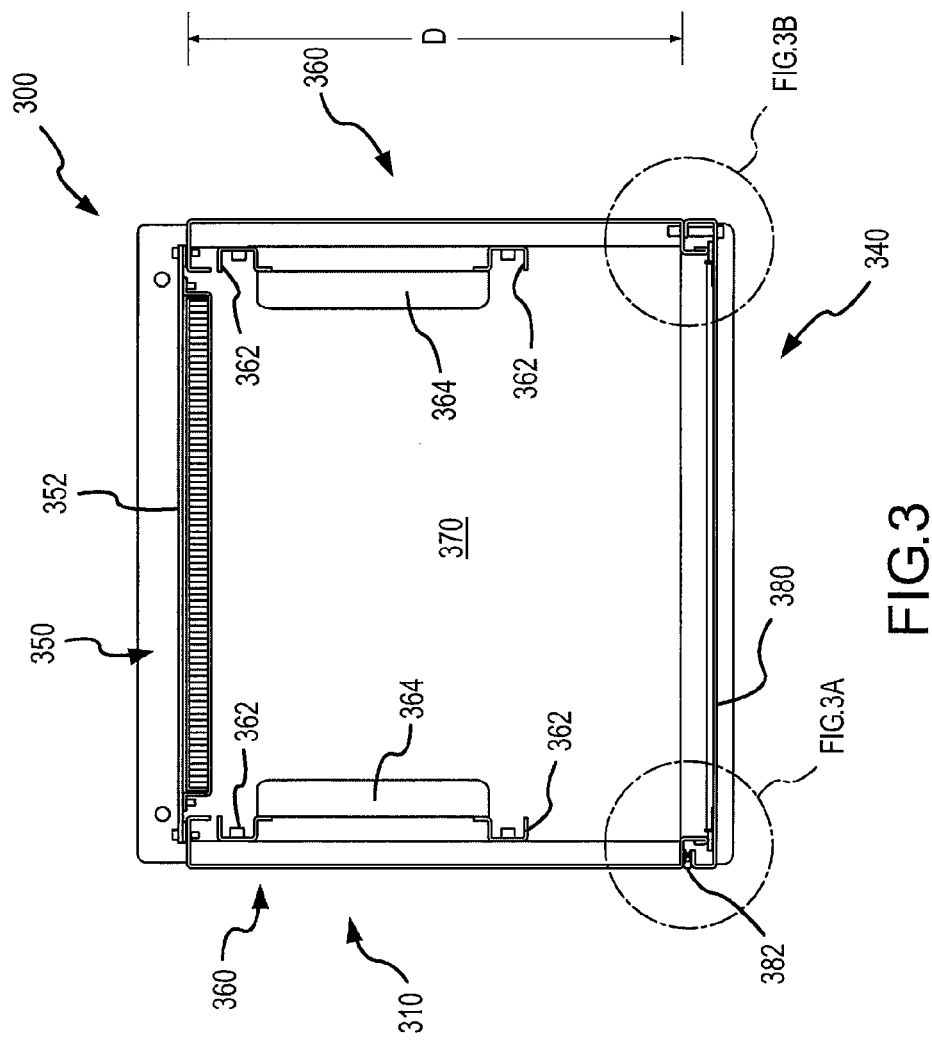

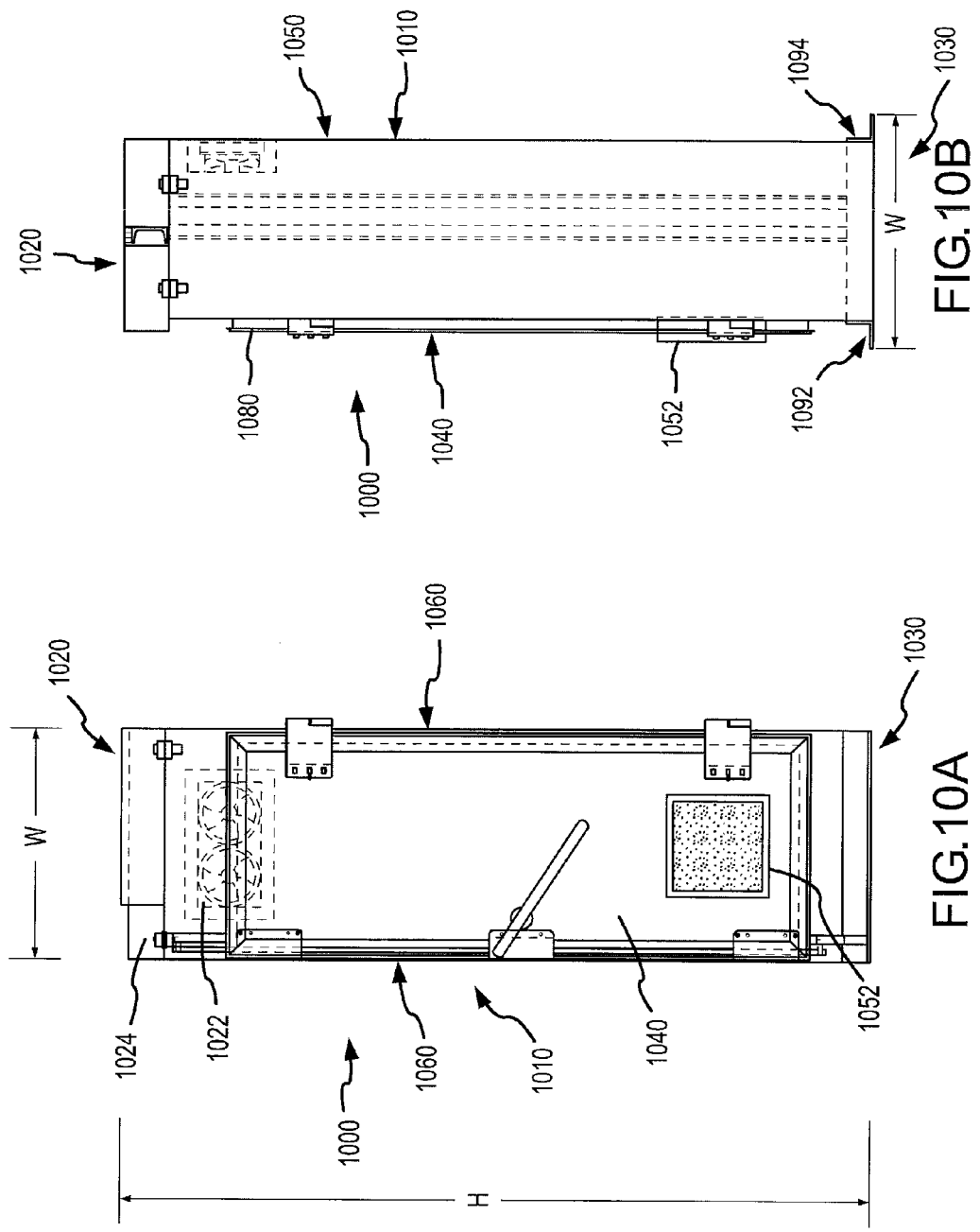

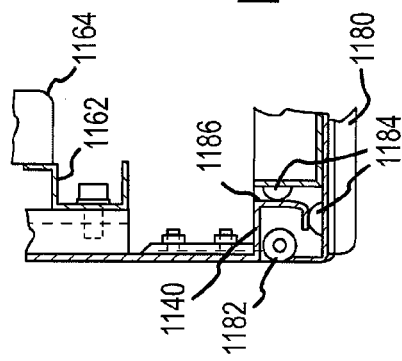
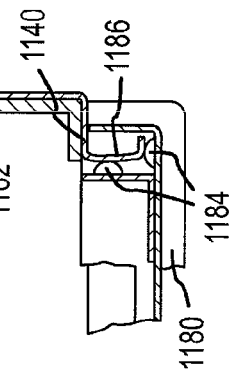
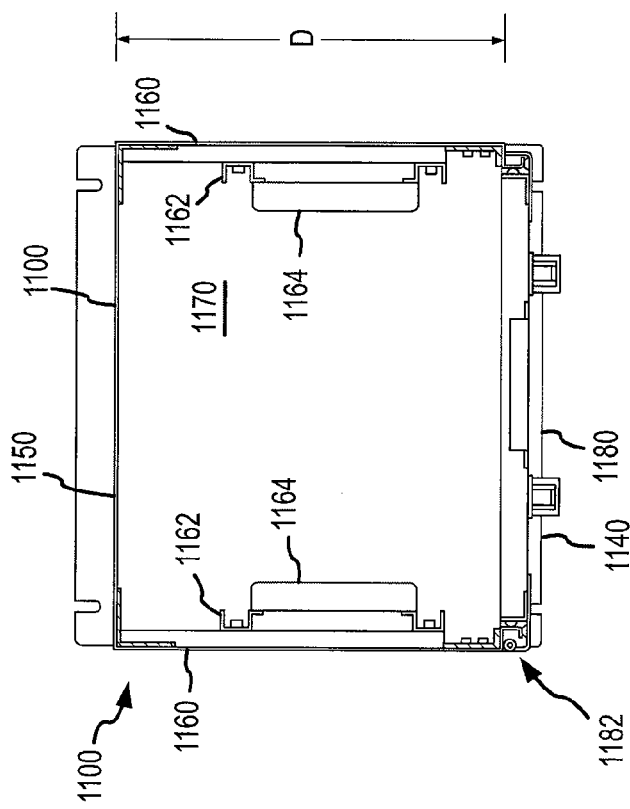

PROTECTIVE TELECOMMUNICATIONS ENCLOSURE SYSTEMS AND METHODS

BACKGROUND OF THE INVENTION

Embodiments of the present invention relate to protective containers for electronic equipment, and in particular to enclosure systems and methods for protecting telecommunications equipment from electromagnetic fields.

A nuclear detonation far above the earth's surface, for example at 25 miles above sea level, produces an electromagnetic field known as a high altitude electromagnetic pulse (HEMP). Such pulses or energy spikes can cause damage and failure to power systems, telephone networks, electronic devices, and computers across a large geographical area. Systems connected to power lines and telephone wires are particularly vulnerable to the current and voltage surges resulting from an electromagnetic pulse.

During a HEMP event, damage to telecommunications equipment can be prevented or ameliorated through the use of a protective metallic shielding. For example, telecommunications equipment may be stored in a room having HEMP protected walls. Current approaches for protecting telecommunications racks and enclosures from HEMP exposure are often costly, however, and not well suited for efficient use with standard sized telecommunications storage facilities and components. For example, in some cases custom protected rooms are built to store telecommunications racks. In other cases, vendors lease multiple telecommunications rooms or spaces in which to store oversized hardened enclosures.

What is needed are improved HEMP protection systems and methods that provide shielding to standard telecommunications rack and device components, while utilizing minimal floor space or meeting other spatial dimension requirements for a telecommunications room or space. Embodiments of the present invention address such needs.

BRIEF SUMMARY OF THE INVENTION

A telecommunications enclosure encompasses a case or a housing with an interior rack that is dedicated to the telecommunications function and related support facilities. For example, an enclosure can include an integrated telecommunications cabinet and rack. Advantageously, enclosure embodiments of the present invention can be used efficiently and effectively in any of a variety of telecommunications room or space configurations. These enclosures include electrical and fiber entrances which are placed to accommodate a telecommunications environment.

In a first aspect, embodiments of the present invention provide a method of producing a HEMP protected enclosure for holding an electronic device. The method may include, for example, building a test HEMP protected enclosure according to an enclosure design, performing an acceptance testing procedure on the test HEMP protected enclosure, determining whether the test HEMP protected enclosure meets a HEMP protection level according to MIL STD 188 125 1, and producing a plurality of HEMP protected enclosures according to the enclosure design if the test HEMP protected enclosure meets the HEMP protection level according to MIL STD 188 125 1. In some cases, the test HEMP protected enclosure has a maximum cabinet width dimension that does not exceed about 26 inches and a maximum cabinet depth dimension that does not exceed about 22⅜ inches. In some cases, the test HEMP protected enclosure has a maximum cabinet height dimension that does not exceed about 84 inches. The test HEMP protected enclosure can have a power input point of entry that facilitates entry of a power cable to the interior space from a location external to the cabinet, and a fiber optic cable point of entry that facilitates entry of a fiber optic cable to the interior space from a location external to the cabinet.

In another aspect, embodiments of the present invention provide a HEMP protected enclosure for holding an electronic device. The enclosure can include, for example, a cabinet having an interior space, and a rack disposed within the interior space. The rack can be configured to support the electronic device. The cabinet can have a maximum width dimension that does not exceed about 26 inches and a maximum depth dimension that does not exceed about 22⅜ inches. The enclosure can provide a HEMP protection level to the telecommunications device that meets a HEMP protection level according to MIL STD 188 125 1. In some cases, the HEMP protected telecommunications enclosure includes a cabinet having a maximum height dimension that does not exceed about 84 inches. In some cases, the enclosure provides a HEMP protection level to the telecommunications device of at least 100 dB attenuation at 1 GHz. In related cases, the enclosure provides a HEMP protection level to the telecommunications device of at least 80 dB attenuation at 1 GHz. The enclosure can further include a power input point of entry that facilitates entry of a power cable to the interior space from a location external to the cabinet, and a fiber optic cable point of entry that facilitates entry of a fiber optic cable to the interior space from a location external to the cabinet. Similarly, the enclosure may include a converter, and a battery coupled with the converter. The enclosure can also include a power filter. A clean output of the power filter can be disposed within the interior space of the cabinet. A dirty input of the power filter can be disposed external to the cabinet. In some cases, the cabinet includes a front opening that is configured to receive the electronic device therethrough. A front opening of the cabinet can have a width dimension of about 23 inches, and a height dimension of about 71 inches. In some aspects, the enclosure includes a power input point of entry that facilitates entry of a power cable to the interior space from a location external to the cabinet, where the power input point of entry is disposed at a top surface of the enclosure. In some aspects, the enclosure includes a fiber optic cable point of entry that facilitates entry of a fiber optic cable to the interior space from a location external to the cabinet, where the fiber optic cable point of entry is disposed at a top surface of the enclosure. The enclosure may also include a power cable coupled with the power input point of entry, and a fiber optic cable coupled with the fiber optic cable point of entry.

In still another aspect, embodiments of the present invention provide a battery tray for use in a HEMP protected telecommunications enclosure. The battery tray may include a platform configured to support a telecommunications device, and a mounting means coupled with the platform. The mounting means can be disposed above a top surface of the platform. In some cases, the platform has a width dimension that does not exceed about 26 inches, and a depth dimension that does not exceed about 22⅜ inches.

In yet another aspect, embodiments of the present invention encompass a method of providing HEMP protection to a telecommunications device. The method can include placing the telecommunications device in a HEMP protected telecommunications enclosure. The enclosure can include a cabinet having an interior space, and a rack disposed within the interior space. The rack can be configured to support the telecommunications device. The cabinet can have a maximum width dimension that does not exceed about 26 inches and a maximum depth dimension that does not exceed about 22⅜ inches. The enclosure can provide a HEMP protection level to the telecommunications device that meets a HEMP protection level according to MIL STD 188 125 1.

For a fuller understanding of the nature and advantages of the present invention, reference should be had to the ensuing detailed description taken in conjunction with the accompanying drawings.

BRIEF DESCRIPTION OF THE DRAWINGS

FIGS. 2A-F show various views of a HEMP protected telecommunications enclosure 200 according to embodiments of the present invention.

FIGS. 3, 3A, and 3B show transverse views of a HEMP protected telecommunications enclosure according to embodiments of the present invention.

FIGS. 10A and 10B depict various views of a HEMP protected telecommunications enclosure according to embodiments of the present invention.

FIGS. 11, 11A, and 11B show transverse views of enclosure according to embodiments of the present invention.

DETAILED DESCRIPTION OF THE INVENTION

Embodiments of the present invention can enhance the survivability of a telecommunications system or device against an HEMP event, while at the same time providing optimum space utilization of a telecommunications space or room. Telecommunication enclosures meet established standards for HEMP protection, and dimensional specifications for telecommunications infrastructure administration, pathways, spaces, and the like. Enclosures can be pre-wired or pre-packaged for cost-effective shipment and installation. Embodiments provide off-the-shelf solutions and can eliminate the need for customized designs. In some cases, enclosures can provide customized dimensions or components. For example, an enclosure can be customized pursuant to an equipment configuration to provide desired size dimensions and power needs. In some cases, an enclosure may include a custom battery tray.

Figure 1A:
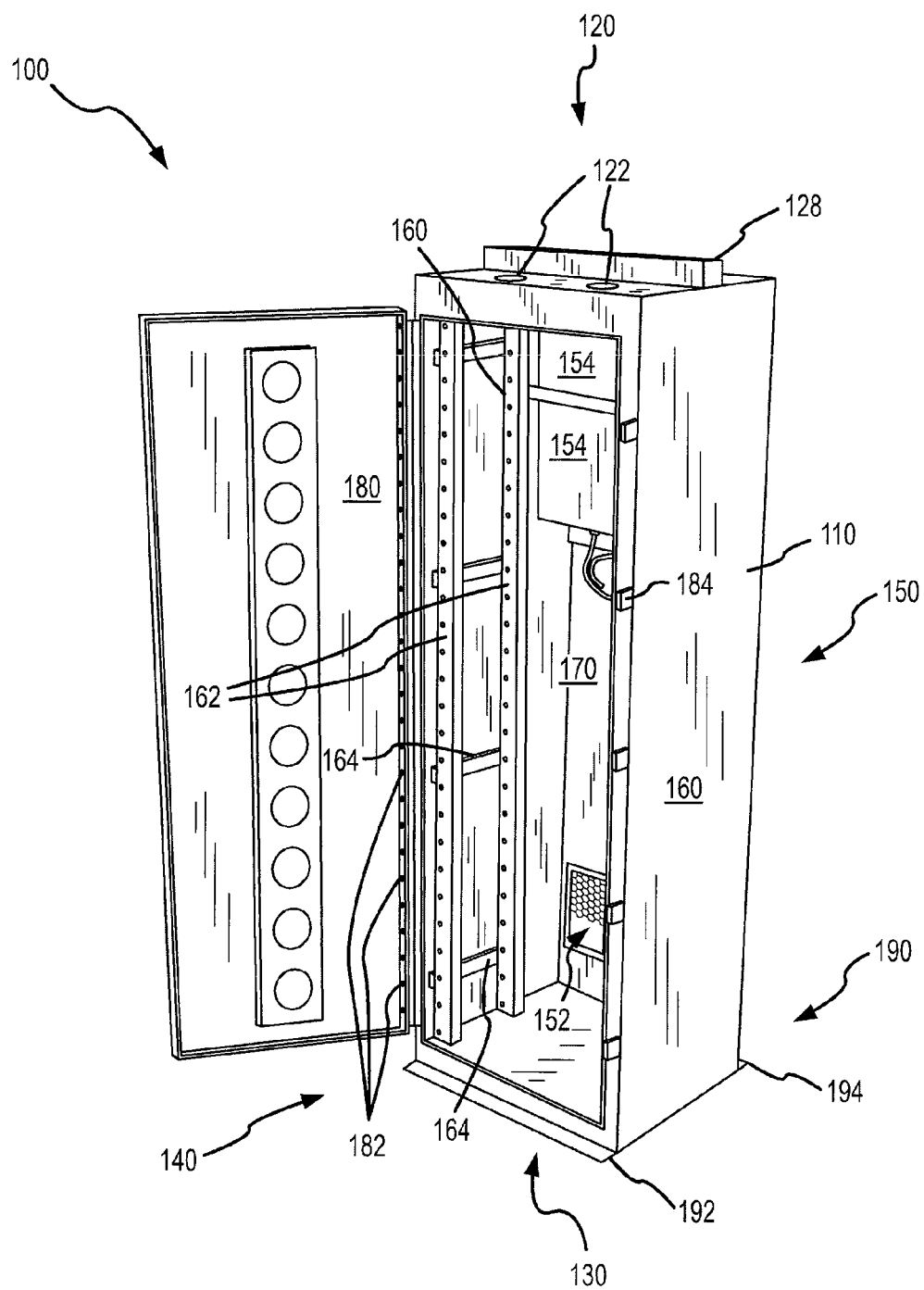
FIGS. 1A-D illustrate various views of a HEMP protected telecommunications enclosure according to embodiments of the present invention.
Figure 1B:
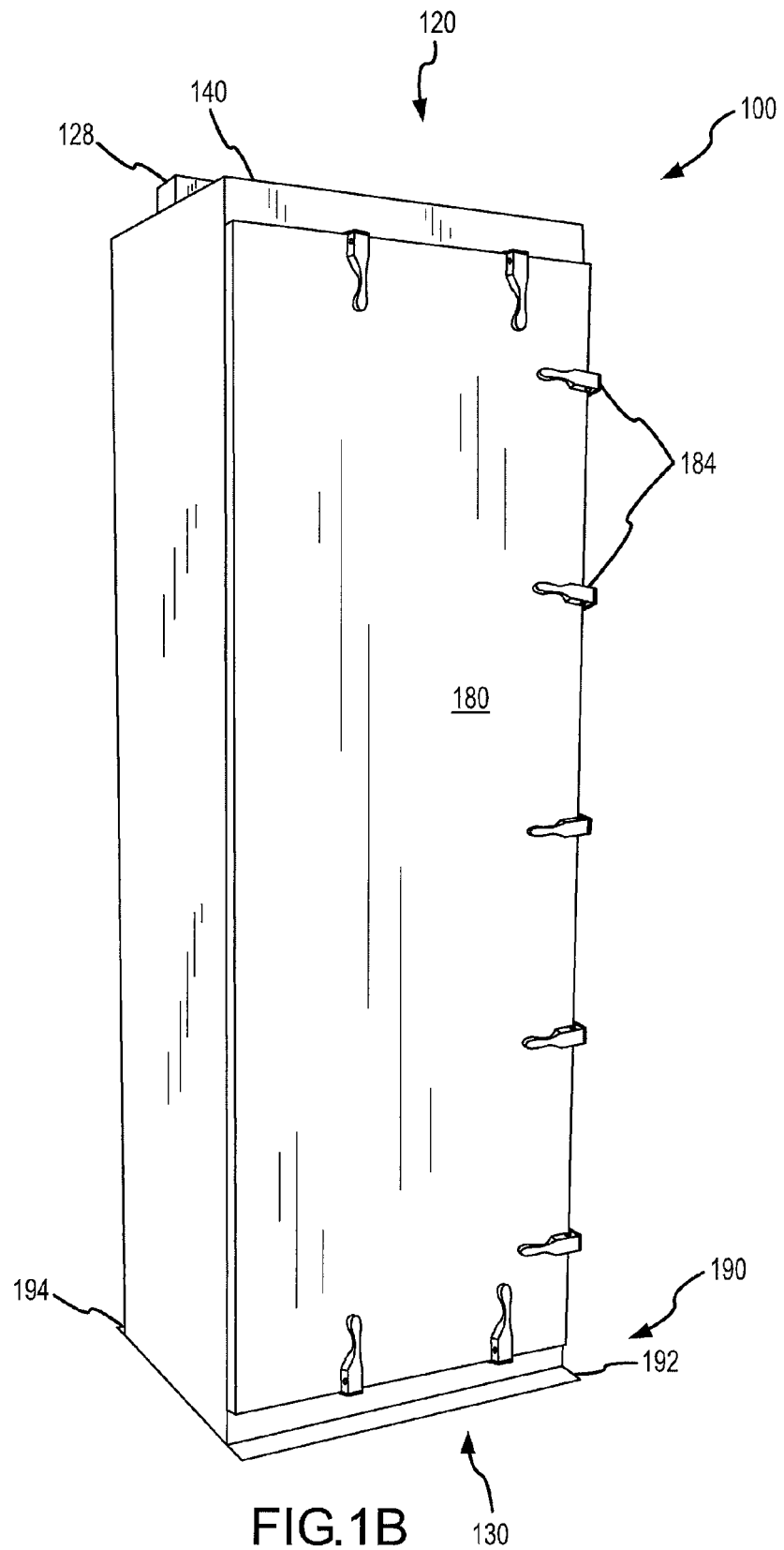
Figure 1C:
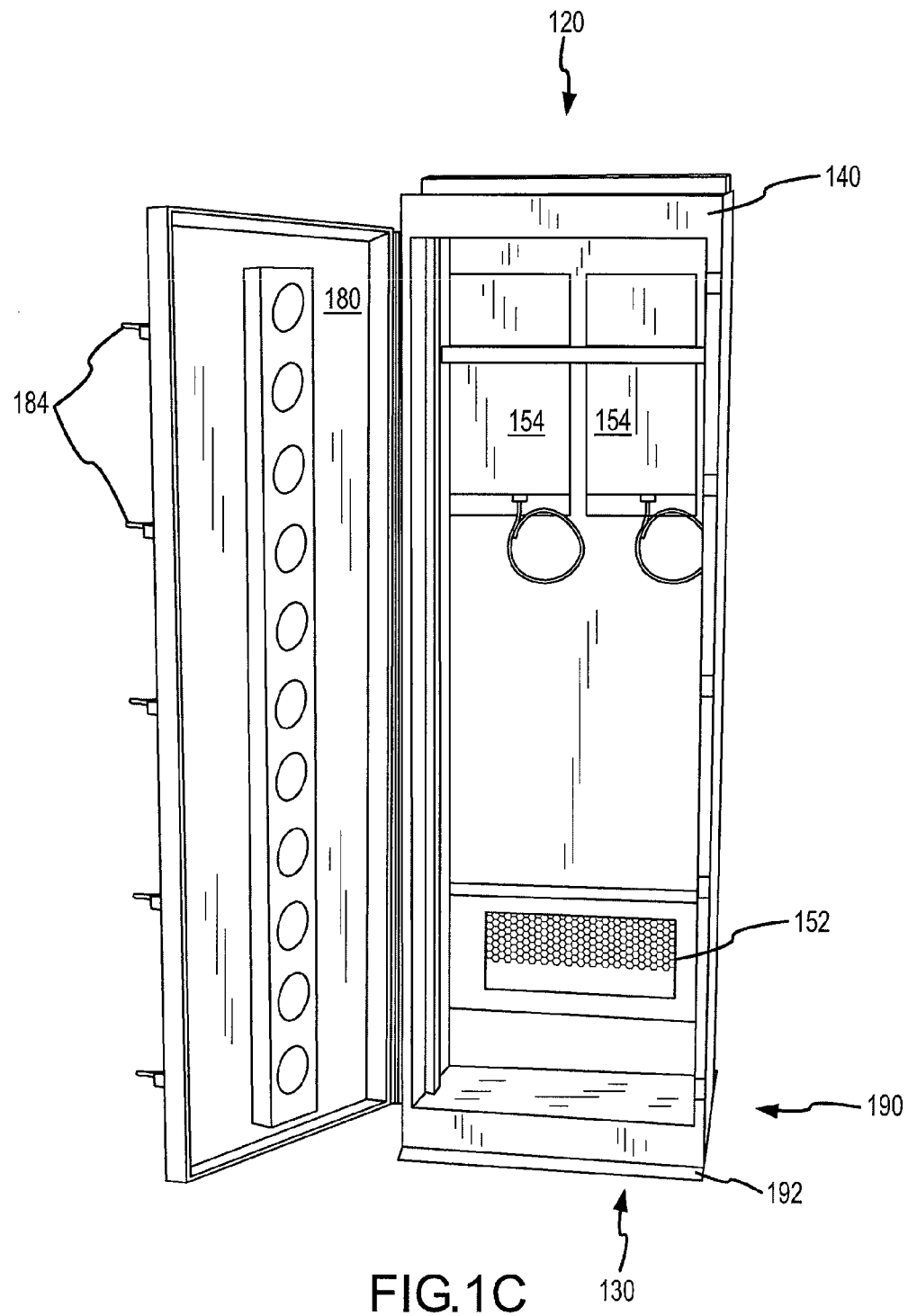
Figure 1D:
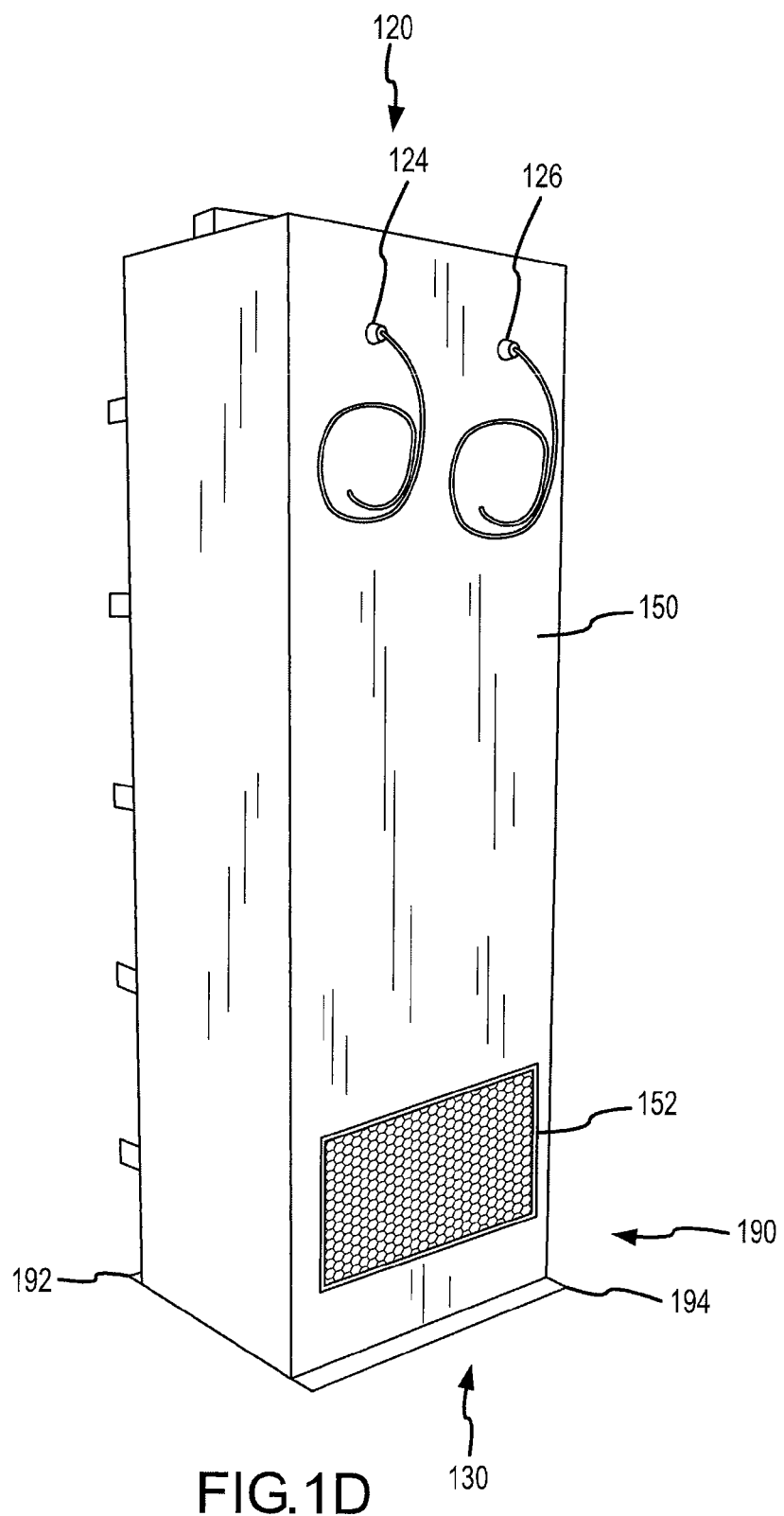

Turning now to the drawings, FIGS. 1A-D illustrate various views of a HEMP protected telecommunications enclosure 100 according to embodiments of the present invention. Telecommunications enclosure 100 includes a cabinet 110 having a top 120, a bottom 130, a front 140, a back 150, and two sides 160. Cabinet 110 defines an interior space 170, and is coupled with a door 180 via a hinge assembly 182. When door 180 is closed, it can be securely fastened to cabinet 110 with latches 184. Typically, door 180 is wide enough to accommodate installation and routine maintenance of equipment housed in cabinet 110, and robust enough to provide adequate shielding. Enclosure 100 also includes an air exhaust system 122 disposed toward top 120 of cabinet 110. Exhaust system 122 may include, for example, two 48 volt fans located at or toward cabinet top 120 and accessible for maintenance and repair. In some cases, exhaust system 122 vents out the top of the cabinet. In some cases, exhaust system 122 vents out the back of the cabinet. In a preferred embodiment, exhaust system 122 vents out the back of the cabinet, toward the top. Enclosure 100 includes rack components such as vertical mounting rails or tapped mounting angles 162 and chassis supports 164 coupled with cabinet sides 160. Enclosure 100 also includes an air intake system 152, a power filter system 154, a fiber optic cable point of entry (POE) 124, and a power input point of entry (POE) 126, each coupled with back 150 of cabinet 110. In some embodiments, interior cables from filter system 154 are clean (FIG. 1C), and exterior cables from filter system 154 are dirty (FIG. 1D).

Telecommunications enclosure 100 also includes a base mounting support 190 having a front flange 192 and a rear flange 194, where each flange extends the widths of cabinet 110. Often, flanges 192, 194 will include means for attachment with a floor or supporting surface. For example, flanges 192, 194 may include apertures for attachment with the floor via floor anchoring bolts. The apertures may be elongated to provide easy installation or to accommodate for less exact installation. In some embodiments, flanges 192, 194 are configured to be as narrow as possible while still accommodating installation via the anchoring bolts or other means of attachment. Telecommunications enclosure 100 may also include a top support 128, which in some cases may include an auxiliary bar welded to the top of cabinet 110. The auxiliary bar can be aligned parallel with the front and back of cabinet 110. In a preferred embodiment, the bar or top support includes three holes, three inches apart, tapped for a ⅝" threaded rod. The top support may be configured to accommodate components mounted on or toward the top of the cabinet, for example a power line filter, a fiber point of entry, and the like. In some embodiments, base mounting support 190 or top mounting support 128, or the combination thereof, can be configured to meet Zone 4 stress requirements.

Enclosure 100 or component parts thereof are typically configured to certain specifications or dimensions. For example, the enclosure can be configured for installation in a standard telecommunications room or space, such that the dimensions of the enclosure do not exceed certain limits. In some cases, enclosure 100 can be manufactured not to exceed a volume or space of about 26" width by about 22⅜" depth by about 84" height. This may include the frame or relay rack size, including panel covers. The enclosure can include two vertical mounting rails on each side, and the forward rails can be located approximately 8 inches into the cabinet as measured from the cabinet front. This particular configuration is useful for enclosures that hold telecommunications equipment. Enclosures that hold computer servers may provide a different mounting rail configuration. The rails can be manufactured from 12 Gauge steel, and can include holes which may be tapped according to an American National Standard. For example, in some embodiments, the rails are tapped with 12-24 National Coarse (NC) holes along their entire length or one or more portions thereof. The holes may be punched so that they are aligned in a straight vertical line, which can allow for ease of telecommunications equipment installation. In some cases, enclosure elements such as the vertical mounting rails are configured to meet or exceed seismic standards. For example, the rails can be manufactured to meet a Zone 4 seismic specification. Typically a cabinet includes four vertical mounting rails. Embodiments of the present invention include enclosures and component elements thereof that are constructed according to certain procedures or standard specifications such as MIL-HDBK-423. In some embodiments, enclosure 100 is configured for placement in a hut or prefabricated building located along a telecommunications backbone, at least part of which may be near a railroad grid or right-of-way.

Enclosure 100 can define an electromagnetic barrier, so as to prevent or limit HEMP fields and conducted transients from entering the enclosed space. In some cases, enclosure 100 complies with minimum requirements or design objects as set forth in certain standards, such as MIL-STD-188-125-1 (including Appendices), which is a standard for high-altitude electromagnetic pulse (HEMP) protection for ground-based facilities performing critical, time-urgent missions. For example, embodiments of the present invention encompass enclosures and component parts that provide at least about 80 dB attenuation at 1 GHz. In some embodiments, enclosures and component parts provide at least about 100 dB attenuation at 1 GHz. Enclosure 100 and components thereof can also comply with safety, spatial and environmental design guidelines applied to telecommunications equipment, such as NEBS™. Similarly, enclosure 100 and components thereof can comply with documents such as Telcordia Technologies GR-63-CORE and GR-1089-CORE, as well as related standards required by or developed by organizations such as FCC, CISPR, IEC, IEEE, ASTM, ANSI, and ETSI. The fiber optic cable point of entry can include a shielded wave guide, and in some cases is located on the top of the enclosure, toward the front, so as to allow for ease of internal cable management. In some cases, an air intake system includes a shielded passive vent, which may be constructed of machined, steel honeycomb. The vent can be circumferentially welded to a mounting surface or cabinet surface according to a procedure or standard specification such as MIL-HDBK-423.

FIGS. 2A-F show various views of a HEMP protected telecommunications enclosure 200 according to embodiments of the present invention. Telecommunications enclosure 200 includes a cabinet 210 having a top 220, a bottom 230, a front 240, a back 250, and two sides 260. In some embodiments, cabinet 210 has or does not exceed a total height H of 81 inches, a total width W of 26 inches, and a total depth D of 20 inches. In a preferred embodiment, total height H is 84 inches. Depth D may represent the distance from the exterior front surface of door 280 to the back surface of cabinet back 250, and in some cases does not include front flange 292, rear flange 294, or air intake system 252. Enclosure 200 may also include a top support or structural angle 228 that can be adjusted or moved to any desired position between front 240 and back 250. Top support 228 can be coupled with one or more auxiliary bars 229. Cabinet 210 includes struts 212 along which auxiliary bars 229 may slide or move, thus allowing top support 228 to be adjustably positioned to any location between cabinet front 240 and cabinet back 250, as indicated by arrow 228'. Auxiliary bars 229 are coupled with struts 212 via spring nuts 214. In a preferred embodiment, the enclosure does not include an adjustable top support and auxiliary bars, struts, and spring nuts.

In some cases, enclosure 200 includes one or more fire wall shelves 268. These shelves can be perforated for air flow, and can be adjusted or moved to any desired position between top 220 and bottom 230. Typically, a fire wall shelf 268 is installed above a piece of telecommunications equipment. In a preferred embodiment, the enclosure does not include a fire wall shelf. Cabinet 210 defines an interior space 270, and is coupled with a door 280 via a hinge assembly 282. Enclosure 200 also includes an air exhaust system 222, a fiber optic cable point of entry 224, and a DC power input point of entry 226, each disposed toward top 220 of cabinet 210. Fiber optic cable POE 224 can include a wave guide with an EMI/RFI gasket. Air exhaust system 222 can provide, for example, an air flow rate of 450 cubic feet per minute (CFM). For example, the system can include two DC fans providing 225 CFM each. In some embodiments, the system includes two P1751 DC fans, available from Pelonis Technologies, Inc. (Malvern, Pa.). Enclosure 200 includes vertical mounting rails 262 and chassis supports 264 coupled with cabinet sides 260. Chassis supports 264 can be adjustable to any desired position between top 220 and bottom 230, and can provide support for chassis shelves 266. In a preferred embodiment, the chassis supports are fixed, and not adjustable. Depending on how much equipment is placed inside the enclosure, any number of fixed or sliding fire wall shelves 268 or chassis shelves 266 may be needed or desired. In some cases, one or more of these shelves can be configured to comply with safety, spatial and environmental design guidelines applied to telecommunications equipment, such as NEBS™.

Enclosure 200 also includes an air intake system 252 coupled with back 250 of cabinet 210, and a power filter system 254 disposed near cabinet top 220. In some embodiments, power filter system 254 includes a power vault with one or more DC-line filters, and converts a dirty electrical input to a clean electrical output that is transmitted to a load. Power filter system 254 may be mounted on the interior of cabinet 210. In a preferred embodiment, the power filter system is mounted on the exterior of cabinet 210. Enclosure 200 can be installed according to standard installation techniques without incurring damage to power filter system 254. Air intake system 252 can include a removable and washable outside dust filter 252a and an inside one inch thick steel electromagnetic interference (EMI) and radiofrequency interference (RFI) honeycomb filter 252b. In a preferred embodiment, the air intake system does not include a dust filter. An enclosure can include durable hinges, latches, and handles that will not buckle, misalign, or degrade over an approximately 20 year lifespan. The front of the enclosure will typically define a large enough opening to allow for ease of equipment installation and maintenance. For example, the size of the opening can be maximized to allow for removal of installed telecommunications components such as cards.

FIGS. 3, 3A, and 3B show transverse views of enclosure 300 according to embodiments of the present invention. FIG. 3 corresponds to Section A-A as depicted in FIG. 2A. Telecommunications enclosure 300 includes a cabinet 310 having a front 340, a back 350, and two sides 360. Cabinet 310 defines an interior space 370, and is coupled with a door 380 via a hinge assembly 382. In some embodiments, hinge assembly 382 includes a piano hinge. In a preferred embodiment, the hinge assembly does not include a piano hinge. Enclosure 300 includes vertical mounting rails 362 and chassis supports 364 coupled with cabinet sides 360. Enclosure 300 also includes an air intake system 352 coupled with back 350 of cabinet 310 interior. Door 380 can be sealed with cabinet front 340 with a gasket 384 that extends around a door opening rim 386. In some embodiments, gasket 384 includes a knife edge/copper finger stock gasketing. Enclosure gaskets such as gasket 384 can provide an air seal, an RFI seal, or any other suitable seal, for example as specified in MIL-STD-188-125-1. In a preferred embodiment, the door is not sealed with the cabinet front with a gasket that extends around a door opening rim. Cabinet 310 can have a depth D that extends from cabinet front 340 to cabinet back 350, where depth D is or does not exceed 20 inches. A distance between the left door opening rim 386 (FIG. 3A) and the right door opening rim 386 (FIG. 3B), which may also be referred to as a clear opening, can be within a range from about 19 inches to about 22 inches. In some embodiments, this width dimension is about 20.5 inches. In a preferred embodiment, this width dimension is about 23.5 inches. What is more, this width dimension can be modified when the enclosure is configured as a double-wide design. The width dimension can be configured so as to facilitate telecommunications equipment installation and maintenance activities. In some cases, the depth of rim 386 is about 1.125 inches. In some cases, the thickness of gasket 384 is about 0.250 inches. As noted above, in a preferred embodiment the door is not sealed with the cabinet front with a gasket that extends around a door opening rim.

Figure 4:
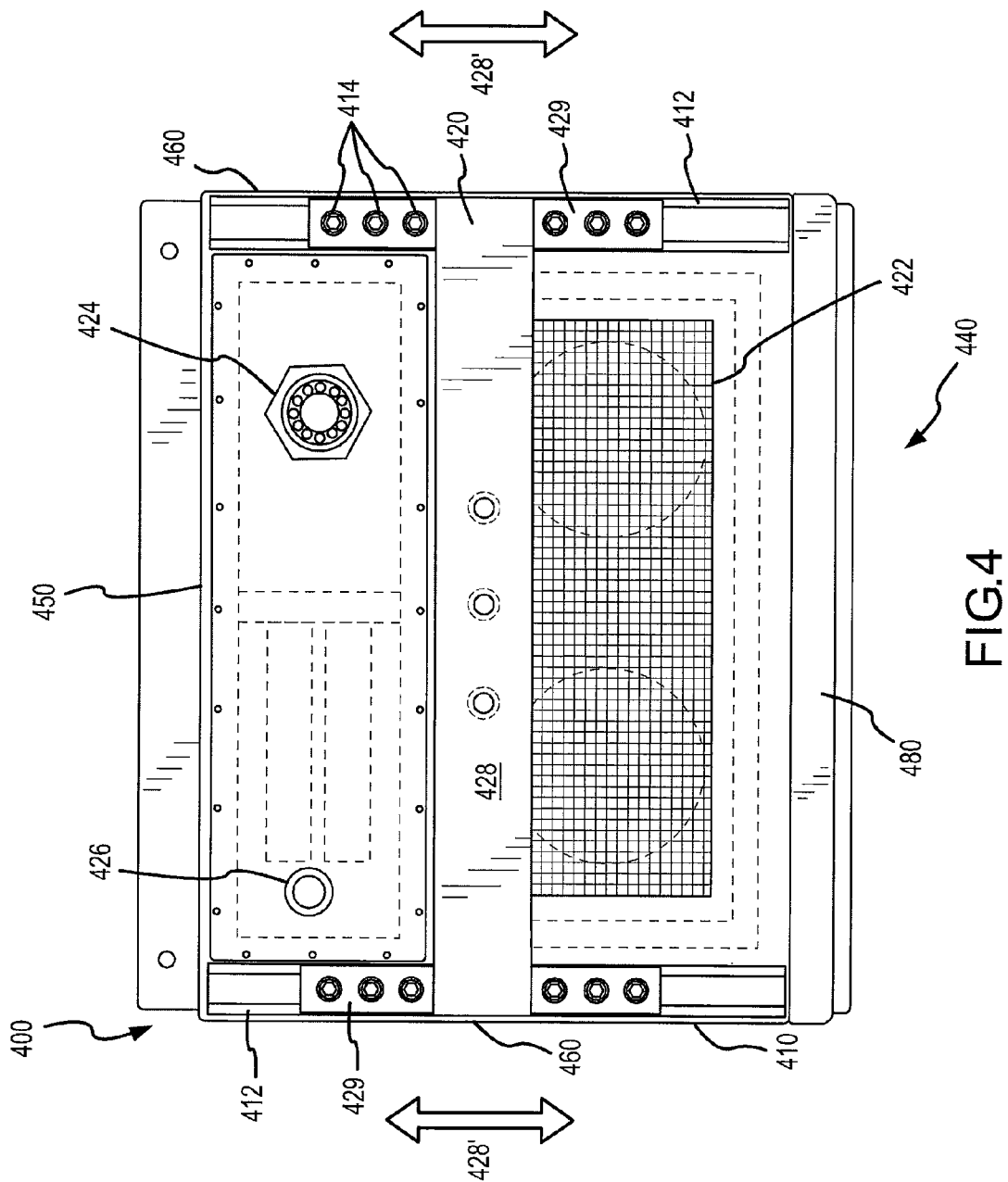
FIG. 4 shows a top view of an enclosure according to embodiments of the present invention.

A top view of an enclosure 400 is shown in FIG. 4, according to embodiments of the present invention. Telecommunications enclosure 400 includes a cabinet 410 having a top 420, a front 440, a back 450, and two sides 460. Enclosure 400 also includes a top support 428 coupled with two auxiliary bars 429. Cabinet 410 includes two struts 412 along which auxiliary bars 429 may slide or move, thus allowing top support 428 to be adjustably positioned to any location between cabinet front 440 and cabinet back 450, as indicated by arrows 428'. Auxiliary bars 429 are coupled with struts 412 via spring nuts 414. In a preferred embodiment, the top support is fixed, and not adjustable.

Figure 5:
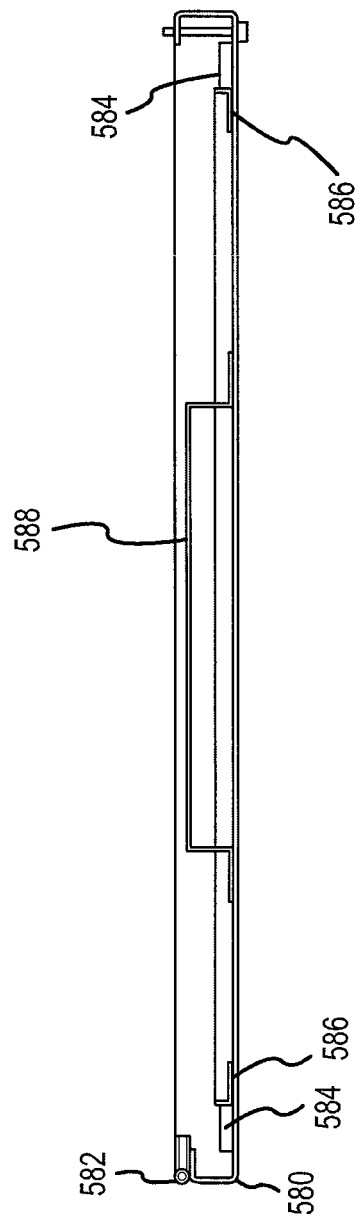
FIG. 5 depicts a top view of an enclosure door according to embodiments of the present invention.

Cabinet 410 is coupled with a door 480 via a hinge assembly (not shown). Enclosure 400 also includes an air exhaust system 422, a fiber optic cable point of entry 424 and a power input point of entry 426 disposed toward top 420 of cabinet 410. In some embodiments, fiber optic cable POE and power input POE 426 are configured with grommets. In a preferred embodiment, the enclosure does not include a fiber optic cable POE and power input POE configured with grommets. FIG. 5 shows a top view of a door 580 according to embodiments of the present invention. Door 580 is coupled with a hinge assembly 582 for attachment with an enclosure cabinet, a gasket 584, a gasket guide 586, and a hat section stiffener 588. Gasket 584 and gasket guide 586 extend around the perimeter of door 580 to provide a seal between door 580 and the front of the cabinet. In a preferred embodiment, the enclosure does not include a gasket and gasket guide extending around the perimeter of the door.

Figure 6A:
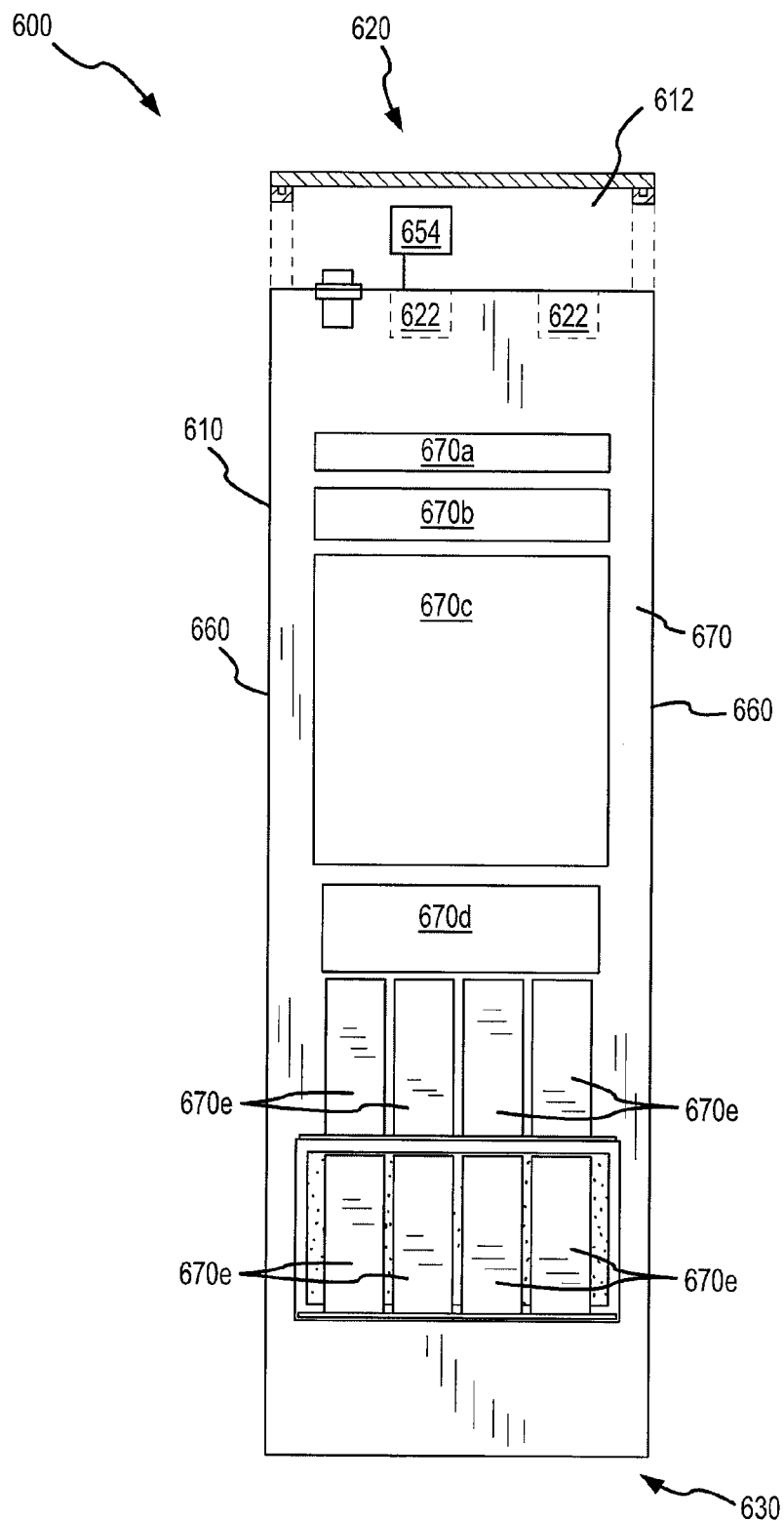
FIG. 6A provides a front view and FIG. 6B provides a cutaway side view of a HEMP protected telecommunications enclosure according to embodiments of the present FIG. 7 provides a schematic of a HEMP protected telecommunications enclosure according to embodiments of the present invention
Figure 6B:
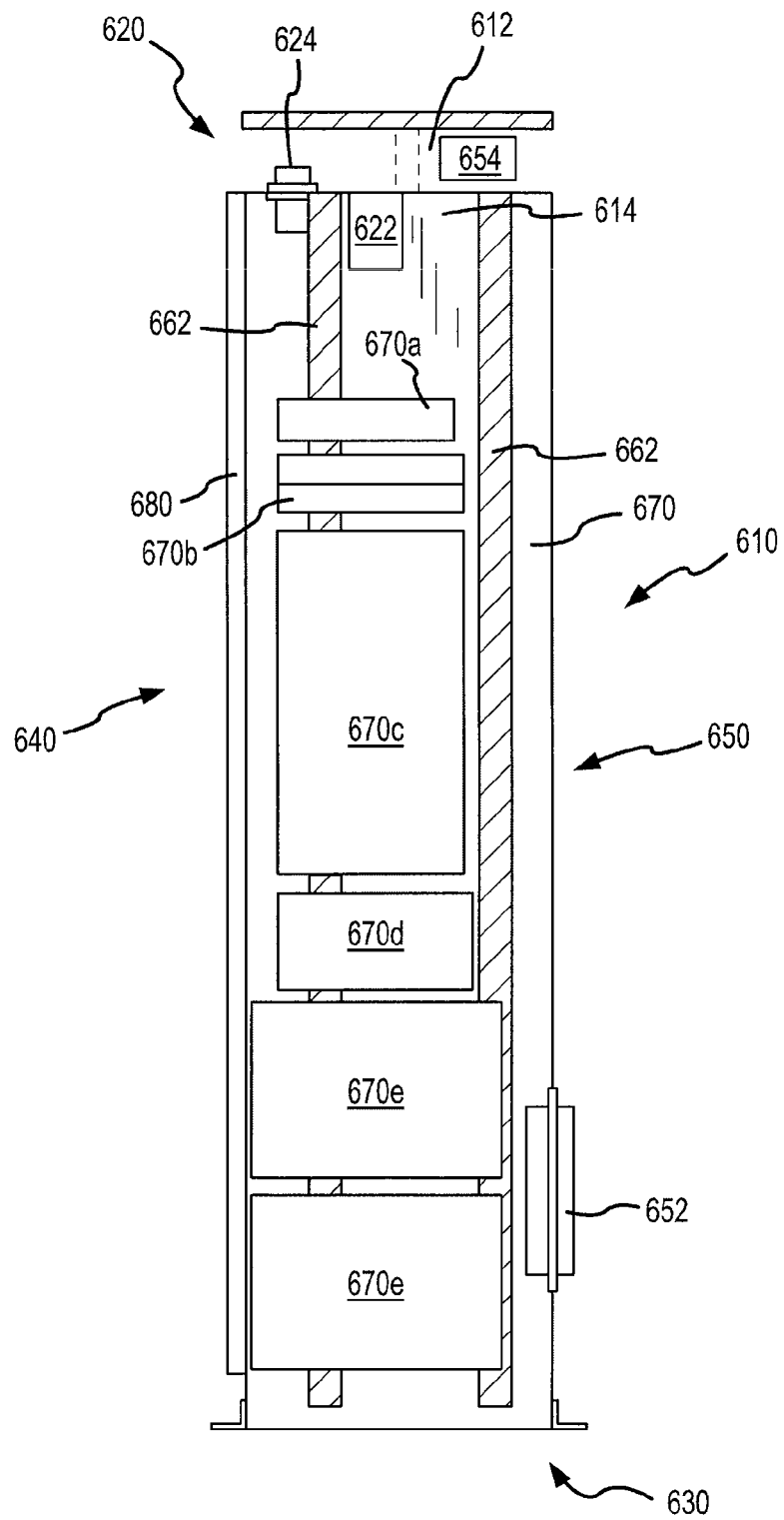

FIG. 6A provides a front view and FIG. 6B provides a cutaway side view of a HEMP protected telecommunications enclosure 600 according to embodiments of the present invention. Telecommunications enclosure 600 includes a cabinet 610 having a top 620, a bottom 630, a front 640, a back 650, and two sides 660. Cabinet 610 is coupled with a door 680, and includes a fiber optic cable point of entry 624. Enclosure 600 includes vertical mounting rails 662 coupled with cabinet sides 660. Cabinet 610 includes an exterior room 612 configured to house a power filter system 654, and an interior room 614 configured to house an air exhaust system 622. In some embodiments, power filter system 654 includes a power vault with one or more DC-line filters, and converts a dirty electrical input (located exterior to the enclosure) to a clean electrical output (located within the enclosure) that is transmitted to a load. Cabinet 610 defines an interior space 670, which can house any of a variety of telecommunications components, including a Ciena transport equipment module 670a, a dispersion compensation module (DCM) 670b, a Ciena transport equipment module 670c, a DC converter 670d, and a battery string 670e. In a preferred embodiment, the enclosure includes two battery strings. In some embodiments, an enclosure does not include a transport equipment module. Two battery strings 670e can provide stand-along self-sufficiency to enclosure 600 during a power outage. For example, a first string can provide power to the load, and the second string can provide N+1 protection, where N is the number of battery strings required to satisfy the backup time requirement based on the current load. The +1 is (1) additional string as a redundancy precaution. In a preferred embodiment, (1) string is needed to satisfy the total back-up power requirements for a minimum of 8 hours plus (1) string for redundancy. Enclosure 600 also includes an air intake system 652 coupled with back 650 of cabinet 610. In some embodiments, telecommunications equipment is installed in an enclosure starting at the bottom, and proceeding toward the top, so as to leave as much empty space toward the top as possible.

Enclosure 600 is typically configured for installation in a standard telecommunications room or space, such that the dimensions of the enclosure do not exceed certain limits. For example, enclosure 600 can be manufactured not to exceed dimensions of about 26" in width, about 22⅜" in depth, and about 84" in height, including any exterior mounted power line filters, but exclusive of any door handles, hinges, air intake vents, or bottom or top bracing.

Enclosure 600 can also be constructed so as to accommodate or support telecommunications equipment having certain parameters. For example, enclosure 600 can be constructed to accommodate two battery strings, each weighing about 282.4 pounds, and a DC-DC converter weighing about 30 pounds. In some cases, enclosure 600 can be constructed to support and house telecommunications equipment having a combined weight of about 333 pounds. In some cases, this combined weight may be in a range from about 200 pounds to about 500 pounds. In some embodiments, the cabinet occupies a minimal amount of space, while still being able to accommodate installation of telecommunications equipment and routine maintenance of fans and filters. In some embodiments, the enclosure contains other electronic equipment in addition to or instead of telecommunications equipment.

Figure 7:
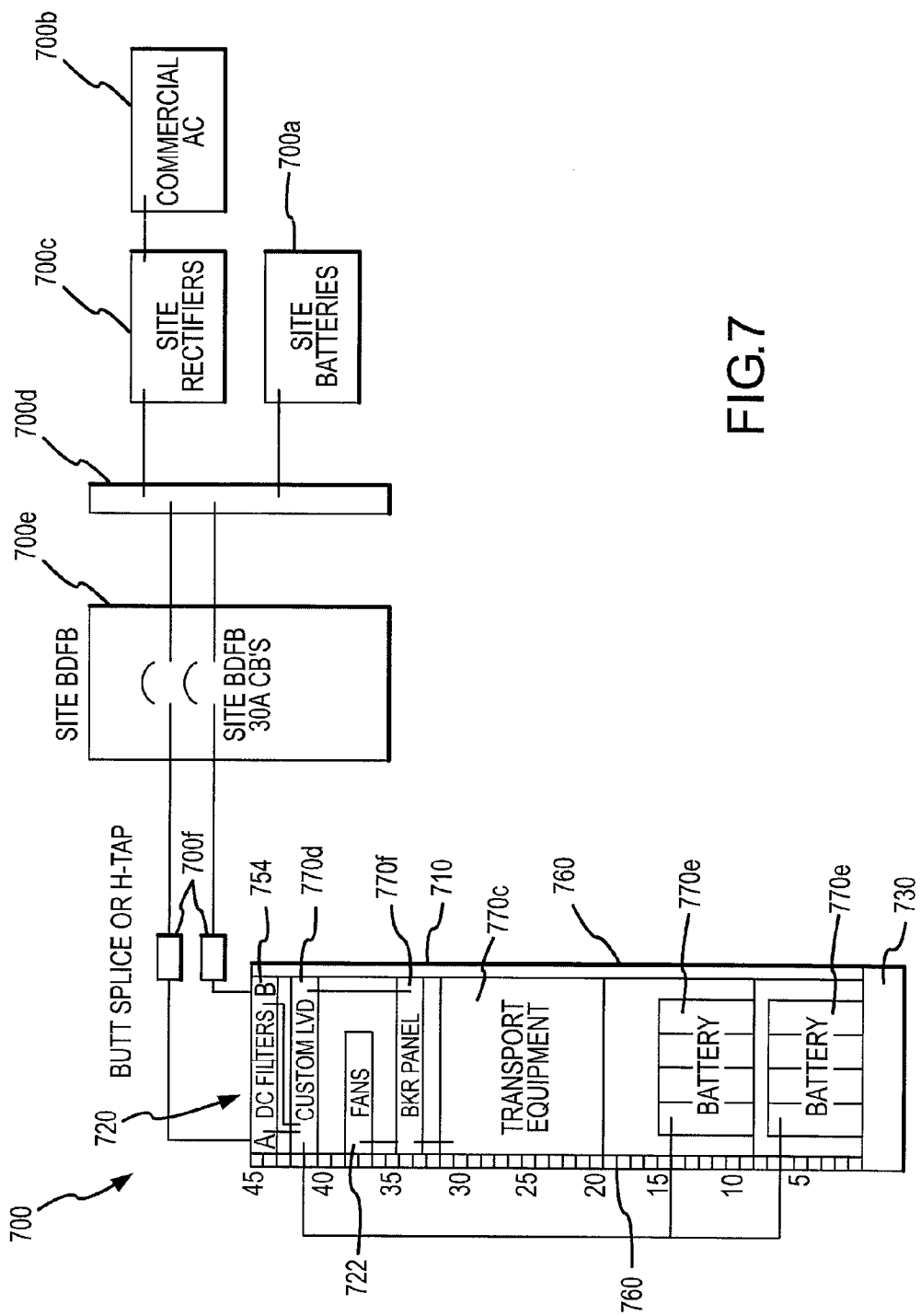

FIG. 7 provides a schematic of a HEMP protected telecommunications enclosure 700 according to one embodiment of the present invention, and illustrates how power can be brought from an external site into the interior of enclosure 700. Telecommunications enclosure 700 includes a cabinet 710 having a top 720, a bottom 730, and two sides 760. Cabinet 710 includes a power filter system 754, a DC converter 770d, an air exhaust system 722, a breaker panel 770f, a Ciena transport equipment module 770c, and two battery strings 770e. In some embodiments, the enclosure does not include a transport equipment module. In some embodiments, during operation site power can be supplied to the cabinet from site batteries 700a or commercial AC 700b. Where the power source is commercial AC 700b, power is transmitted through site rectifiers 700c. Power is then transmitted through a buss 700d, such as a −48v site DC buss, optionally through a site battery distribution feeder bay 700e, and through a butt splice or H-tap 700f. In some embodiments, 60 amp breakers may be required or desired at the BDFB to insure that the recharge current for the cabinet batteries does not trip the BDFB breakers. Breaker panel 770f, which is attached with fans 722 and transport equipment 770c, acts as a load. Similarly, batteries 770e act as a load. When site power is lost, or when site voltage drops below a threshold, site power can be disconnected at a custom DC converter 770d, and cabinet batteries 770e will carry the load for the cabinet. When site power is restored, for example via commercial AC or a generator, custom DC converter 770d can switch back to normal operation and the cabinet can be powered via site power. The A and B side of filter system 754 can provide redundancy to filter. For example, if the A side is compromised, the B side can accommodate the needs of the enclosure system. In some embodiments, an estimated maximum load includes 2 amps for fans and 11.6 amps for transport equipment.

In some embodiments, custom DC converter 770d may include, for example, a −48 VDC to −48 VDC converter, for example a Valere −48v to −48v converter, shelf part #HK25S-ANN-VT, converter module part #DCHF1000AA-VV26. During normal operation, site power can be supplied to the cabinet. Breaker panel 770f, which may be coupled with fans 722 and transport equipment 770c, and cabinet batteries 770e may act as loads. When the DC input voltage drops below a low operating threshold of the converter input, which may occur due site battery drain after an extended DC power outage, the converter can stop converting site DC and cabinet batteries 770e can carry the load for only the cabinet. When site power is restored, for example via commercial AC or a generator, or the converter input voltage rises above the input threshold, the converter can resume converting site DC and the cabinet can be powered and the cabinet batteries can be charged via the site power. In a preferred embodiment, the enclosure is configured so that if the site loses power, the cabinet batteries pick up only the cabinet load and not the rest of the site. This can be accomplished by the DC converter. When site power is lost or drops below an input voltage threshold the converter shuts off and isolates the site from the cabinet batteries. Thus, the cabinet is powered by the batteries. The converter turns back on when the site power is restored. In some cases the input voltage threshold is relatively low, and a switch from external to internal power can be delayed. This time delay can be a function of the existing load at a site and the Amp Hour (AH) capacity of the site battery plant. A longer delay can correspond to a larger site battery plant AH and a smaller site load. Conversely, a shorter delay can correspond to a smaller site battery plant AH and a larger site load. The time delay can enable the equipment to run off site back up longer thus extending the overall run time of the equipment. In a preferred embodiment, the enclosure is configured to use site power first. In some embodiments, individual sites may have different battery requirements.

The power filter system can include one or more DC HEMP shielded power line filters, such as a 30 amp power filter. Power filters encompass electronic circuits that locate and eliminate surges, harmonic transient currents, spikes, and other unwanted signals in telecommunications equipment. The filters are mounted external to the cabinet, for example on the cabinet top, and can include a dirty input to accommodate an A/B feed coming from the site. In some embodiments, the power filters are installed in accordance with a procedure or standard specification such as MIL-HDBK-423.

The power filter system can also include or be adapted to couple with an external DC power connection. For example, the dirty power input can be configured to receive a wide variety of power cables, such as a #6 power cable (e.g. 6 AWG, XHHW, black, copper, stranded, 10 conductor, 600 volt). In some embodiments, the telecommunications enclosure includes a length of cable extending from the filter, which may be slack and coiled. Cables passing through the enclosure cabinet can be configured in accordance with a procedure or standard specification such as MIL-HDBK-423. In some embodiments, a filter output (e.g. clean) that runs inside of the cabinet is pre-wired with a five foot length of #10 power cable. Various components of the telecommunications enclosure, for example elements for power entry into and exit out of a power filter, may be pre-installed. Enclosures may therefore be well suited for convenient installation. For the exterior of the enclosure, on-site installation power work may include butt splicing site power cables to a #6 cable that protrudes from the enclosure or filter. For the interior of the enclosure, on-site installation power work may include terminating a #10 power cable to a DC converter, which can feed power to a distribution panel for other components in the enclosure. Power filter system 754 can include internal and external DC cables connected to one or more DC filters. In some cases, these cables can be pre-connected to the filters prior to shipment of the cabinet, to protect the integrity of the DC filters during cabinet installation. In a preferred embodiment, DC filters are configured to meet RF and electromagnetic filtering and size requirements or limitations of a customer (e.g. MIL or NEBS™ standards). Such requirements or limitations may encompass standards set forth by a utility or telecommunications company. In some embodiments, a #6 AWG (American Wire Gauge wire size) can be used for a DC filter input (external power) and a #10 AWG can be used for a DC filter output (internal to a cabinet bay). Cabinets having pre-connected cables can reduce the amount of onsite power installation work to standard terminations performed by technicians.

Battery string 770e can be configured to sit on two custom made trays, one disposed above the other, at or toward the bottom of the cabinet. In some cases, the batteries have dimensions of 15.59" length, 16.96" width, and 10.04" height. Trays upon which batteries sit may add 1" height and/or 1' width to the space occupied by the batteries. Any of a variety of batteries can be used in the cabinet, as long as they physically fit inside of the enclosure. For example, a string of Northstar NSB 90 FT batteries can be used to provide 10.8 amps for 8 hours. String dimensions are 15.59" in length, 16.96" in width, and 10.04" in height, and string weight is 282.4 lbs. In some embodiments, cabinet batteries are sized and selected to provide an optimal or desired back-up capacity while still fitting inside the cabinet. Back-up times can be estimated by, for example, calculating worst-case power loads for various transport configurations and comparing to usable batteries. Exemplary estimations are shown in Table 1, where back-up times exceeded a requirement of 8 hours. These estimations include maximum power draws for each equipment configuration. GNB Marathon M12V90FT and NorthStar NSB-90-FT batteries are compared.

TABLE 1

| @ 6 wavelengths | Max Draw (in amps) includes 1.5 amps for fans | Marathon M12V90FT @8 Hours (in amps) | NorthStar NSB.90.FT @8 Hours (in amps) | Time on Battery w/2 strings (in hours) Marathon | Time on Battery w/2 strings (in hours) NorthStar |
|---|---|---|---|---|---|
| Amp | 3.6 | 10.1 | | 45.6 | 48.8 |
| Amp (w/1 Raman) | 5.4 | 10.1 | | 30.3 | 32.4 |
| Amp (w/2 Raman) | 6.3 | 10.1 | | 25.9 | 27.7 |
| Regen | 11.6 | 10.1 | 10.8 | 14.0 | 15.0 |
| Regen (w/Raman) | 13.1 | 10.1 | 10.8 | 12.4 | 13.3 |
| Terminal | 11.6 | 10.1 | 10.8 | 14.0 | 15.0 |
| Terminal (w/Raman) | 13.1 | 10.1 | 10.8 | 12.4 | 13.3 |
| Core Director CI | 44.7 | | 10.8 | | |

In some embodiments, a cabinet can be configured with two strings of NorthStar NSB-90-FT batteries, having dimensions of 10.04" height, 4.24" width, and 15.59" length, at 70.6 lbs per cell and 282.4 lbs per string (4 cells per string). Each string can provide 10.8 amps during an 8 hour discharge, where two strings are equivalent to 21.6 amps per cabinet. In some embodiments, an enclosure can include two strings of EnerSys SBS C11 batteries, providing 11.3 Amps over 8 hours, or 20 Amps over 4 hours. At 6 wavelengths, the EnerSys SBS C11 configuration also provides the following values for reserve time: Amp 51.1, Amp (w/1 Raman) 33.9, Amp (w/2 Raman) 29.0, Regen 15.7, Regen (w/Raman) 13.9, Terminal 15.7, and Terminal (w/Raman) 13.9. The battery length is 15.6", the width is 4.1" per cell or 16.4" per string, and the depth is 10.4". The weight is 246.4 lbs per string.

Figure 8:
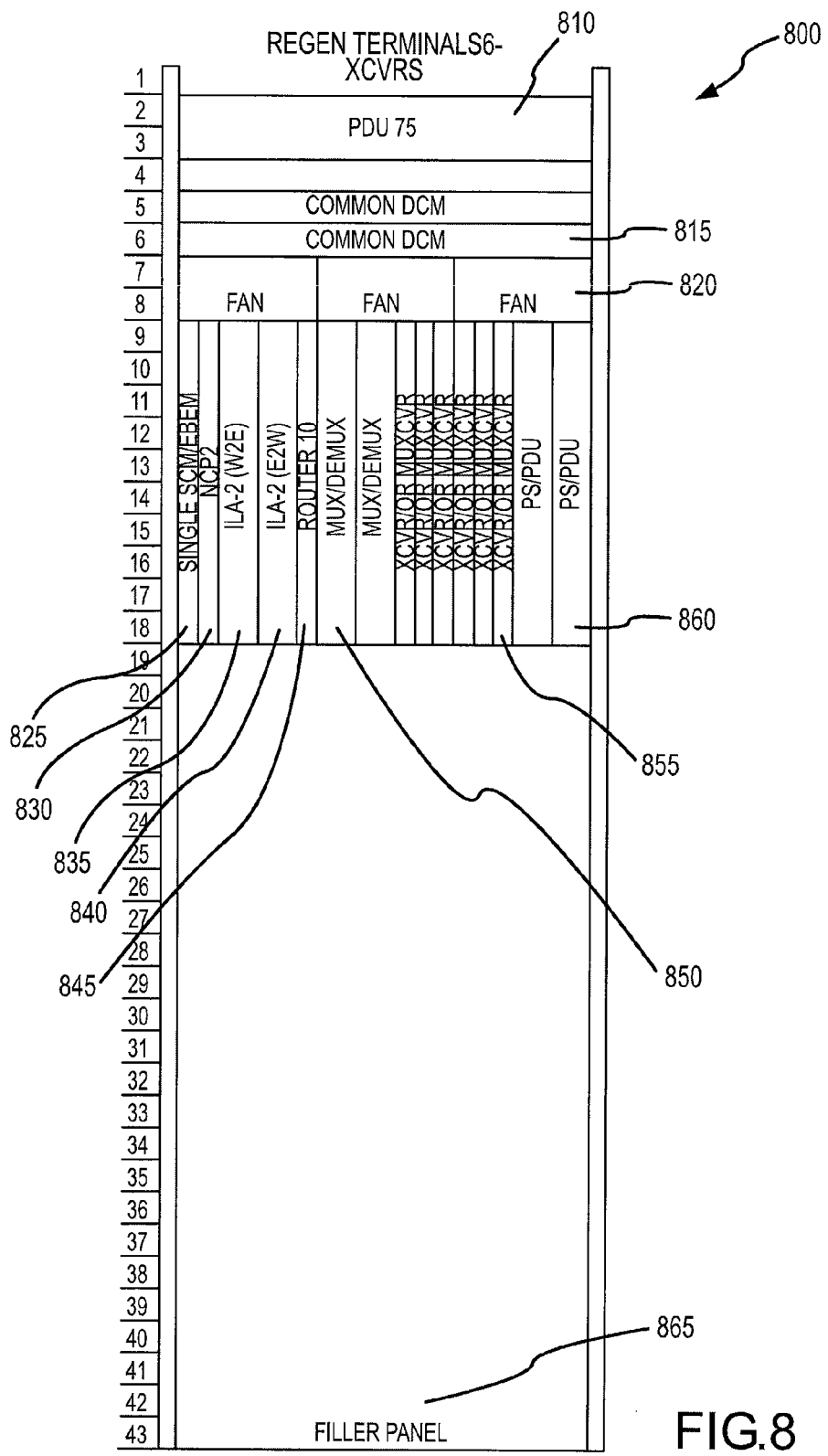
FIG. 8 shows a carding arrangement in a HEMP protected telecommunications enclosure according to embodiments of the present invention.

FIG. 8 shows a carding arrangement in a HEMP protected telecommunications enclosure 800 according to one embodiment of the present invention. A telecommunications rack chassis, for example a Ciena® chassis, will typically include a number of slots configured for receiving enclosure elements such as subscriber cards, line cards, switch fabric modules, and the like. This figure illustrates an exemplary arrangement of cards in a telecommunications enclosure, where the card placement spans from one side to the other. Enclosure embodiments of the present invention provide sufficient room to access and remove the cards through the cabinet door, post-installation, for ongoing maintenance purposes. Components of an enclosure such as a Regen Terminal may include, for example, a power distribution unit (PDU) 810, a common dispersion compensation module (DCM) 815, a fan 820, an SCM/enhanced BE module (EBEM) 825, an NCP2 830, a wreal signal to electrical signal (W2E) (ILA-2) 835, an electrical signal to wreal signal (E2W) integrated line amplifier (ILA-2) 840, a router 845, a multiplexer/demultiplexer (MUX/DEMUX) 850, a transceiver (XCVR) or muxceiver (MUXCVR) 855, a (PS)/power distribution unit (PDU) 860, a filler panel 865, and the like.

Figure 9A:
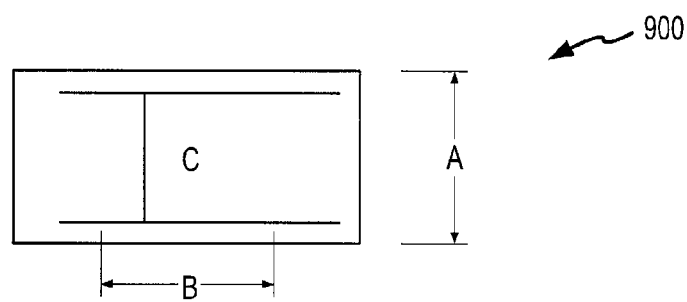
FIGS. 9A and 9B illustrate top views of a telecommunications enclosure cabinet according to embodiments of the present invention.

FIG. 9A illustrates a top view of a telecommunications enclosure cabinet 900 according to embodiments of the present invention. The external depth is represented by A, the distance between the mounting holes of mounting rails is represented by B, and the usable area space is represented by C. In some embodiments, a telecommunications enclosure has an external depth A of about 22.3 inches. In a preferred embodiment, external depth A does not exceed about 22.3 inches. In some embodiments, a telecommunications enclosure has a distance between the mounting holes of mounting rails B of 22¼ inches. In some cases, distance between the mounting holes of mounting rails B can be in a range from between about 18¼ and about 22¼ inches. In some cases, distance between the mounting holes of mounting rails B does not exceed 22¼ inches.

Figure 9B:
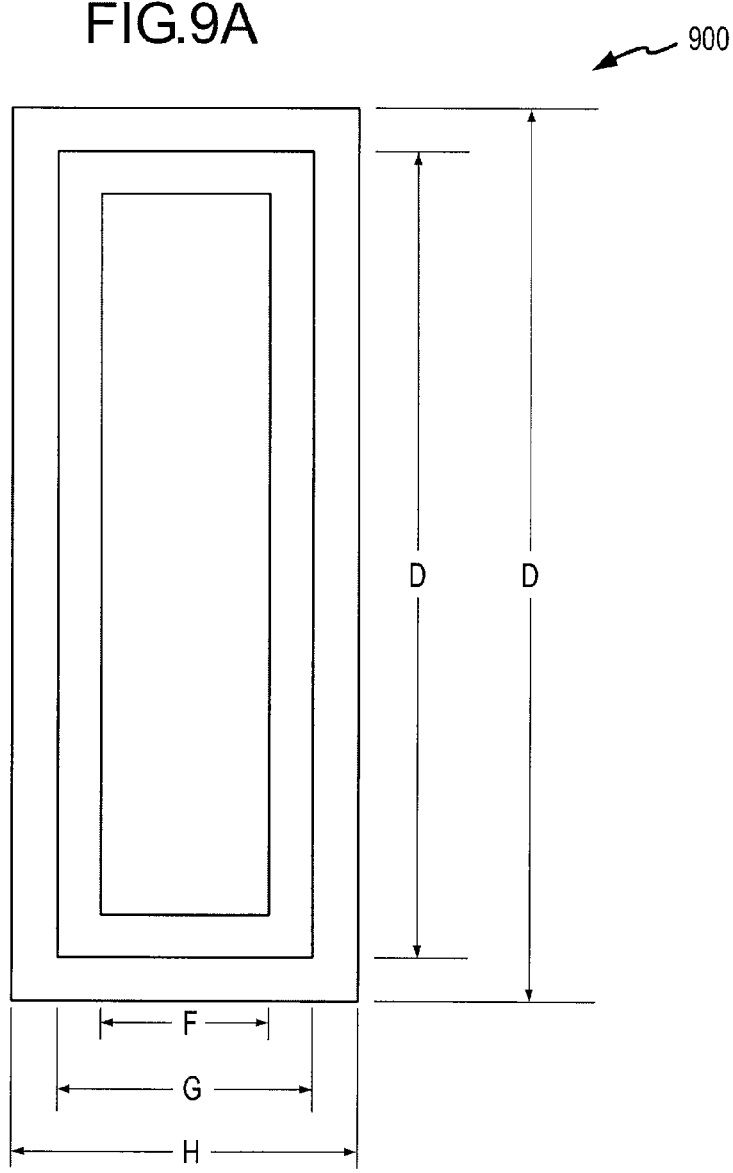

FIG. 9B illustrates a top view of a telecommunications enclosure cabinet 900 according to embodiments of the present invention. The internal usable height is represented by D, the external height is represented by E, the chassis clearance is represented by F, the internal usable width is represented by G, and the external width is represented by H. In some embodiments, a telecommunications enclosure has an external height E of about 84 inches. In a preferred embodiment, external height E does not exceed 84 inches. In a preferred embodiment, a telecommunications enclosure has an external width H of about 26 inches. In a preferred embodiment, external width H does not exceed about 26 inches.

FIGS. 10A and 10B show various views of a HEMP protected telecommunications enclosure 1000 according to embodiments of the present invention. Telecommunications enclosure 1000 includes a cabinet 1010 having a top 1020, a bottom 1030, a front 1040, a back 1050, and two sides 1060. In some embodiments, cabinet 1010 has or does not exceed a total height H of about 84 inches, a total width W of about 26 inches, and a total depth D of about 20 inches. Depth D may represent the distance from the front surface of door 1080 to the back surface of cabinet back 1050, and in some cases does not include front flange 1092, rear flange 1094, or air intake system 1052. Enclosure 1000 may also include a top support or structural angle that can be adjusted or moved to any desired position between front 1040 and back 1050. In a preferred embodiment, the top support is fixed, and not adjustable.

Enclosure 1000 also includes an air exhaust system 1022, one or more fiber optic cable and/or power input points of entry 1024, each disposed toward top 1020 of cabinet 1010. In a preferred embodiment, POE 1024 includes a metal tube. Air exhaust system 1022 can provide, for example, an air flow rate of 450 cubic feet per minute (CFM). For example, the system can include two DC fans providing 225 CFM each. In some embodiments, the system includes two P1751 DC fans, available from Pelonis Technologies, Inc. (Malvern, Pa.). In a preferred embodiment, as shown here, exhaust system 1022 can be disposed on a side of the enclosure 1000, for example the back side 1050.

FIGS. 11, 11A, and 11B show transverse views of enclosure 1100 according to embodiments of the present invention. Telecommunications enclosure 1100 includes a cabinet 1110 having a front 1140, a back 1150, and two sides 1160. Cabinet 1110 defines an interior space 1170, and is coupled with a door 1180 via a hinge assembly 1182. In some embodiments, hinge assembly 1182 includes a hinge. In a preferred embodiment, the hinge assembly includes a sliding cantilever hinge. Such an assembly provides a sliding cantilever on which to place a pivot point, allowing for a desired articulation. Enclosure 1100 includes vertical mounting rails 1162 and chassis supports 1164 coupled with cabinet sides 1160. Door 1180 can be sealed with cabinet front 1140 with a gasket 1184 that extends around a door opening rim 1186. In some embodiments, gasket 1184 includes a knife edge/copper finger stock gasketing. Relatedly, gasket 1184 can include a double finger stock gasket. Enclosure gaskets such as gasket 1184 can provide an air seal, an RFI seal, or any other suitable seal, for example as specified in MIL-STD-188-125-1. Cabinet 1110 has a depth D that extends from cabinet front 1140 to cabinet back 1150, where depth D is or does not exceed about 20 inches. A distance between the left door opening rim 1186 (FIG. 11A) and the right door opening rim 1186 (FIG. 11B) may be in a range of about 19 inches to about 22 inches. A depth of rim 1186 can be about 1.125 inches. In a preferred embodiment, the enclosure does not include a gasket having a knife edge/copper finger stock gasket or a double finger stock gasket.

Figure 12A:
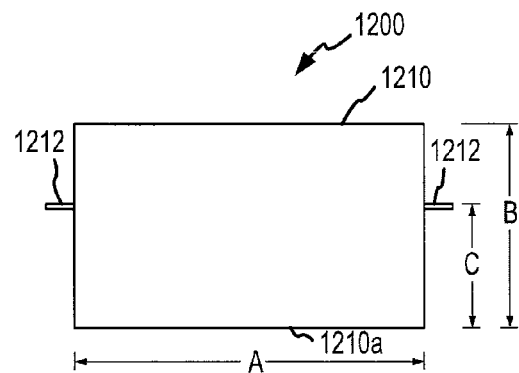
FIGS. 12A-12C show a battery tray according to embodiments of the present invention.
Figure 12B:
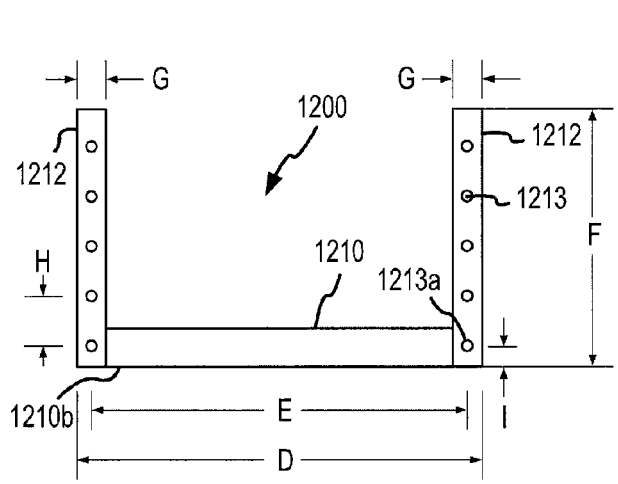
Figure 12C:
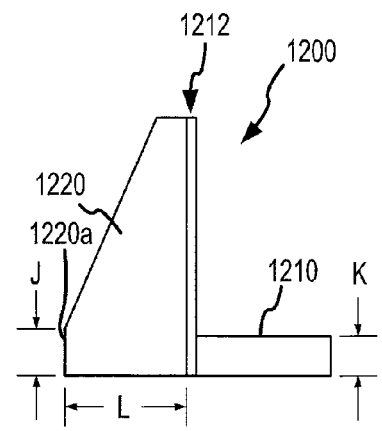

FIGS. 12A-12C show a battery tray 1200 according to one embodiment of the present invention. As illustrated in top view FIG. 12A, tray 1200 includes a platform 1210 and two mounts 1212. Platform width A is about 20⅞ inches. Platform depth B is about 15½ inches. Distance C between platform front 1210a and mount 1212 is about 6⅛ inches. Mounts 1212 are configured to couple with mounting rails in an enclosure. Front view FIG. 12B similarly illustrates platform 1210 and mounts 1212 of tray 1200. Mounts 1212 include mount holes 1213 having a radius of about 3/16 inch. Mount width D is about 23⅞ inches. Mounting hole width E is about 22¼ inches. Tray height F is about 9 inches. Mount width G is about 1⅝ inches. Mount hole spacing distance H is about 1¾ inches. Distance I between platform bottom 1210b and lower mount hole 1213a is about 1 inch. As shown in side view FIG. 12C, tray 1200 includes platform 1210, mount 1212, and front side panel 1220. Front side panel leading edge height 1220a is about 1½ inches. Platform height K is about 1½ inches. Front side panel depth L is about 6⅛ inches. Battery tray 1200 can provide advantages over some known trays that mount from the cabinet bottom, or that may not otherwise easily fit or mount into the enclosure.

Figure 13A:
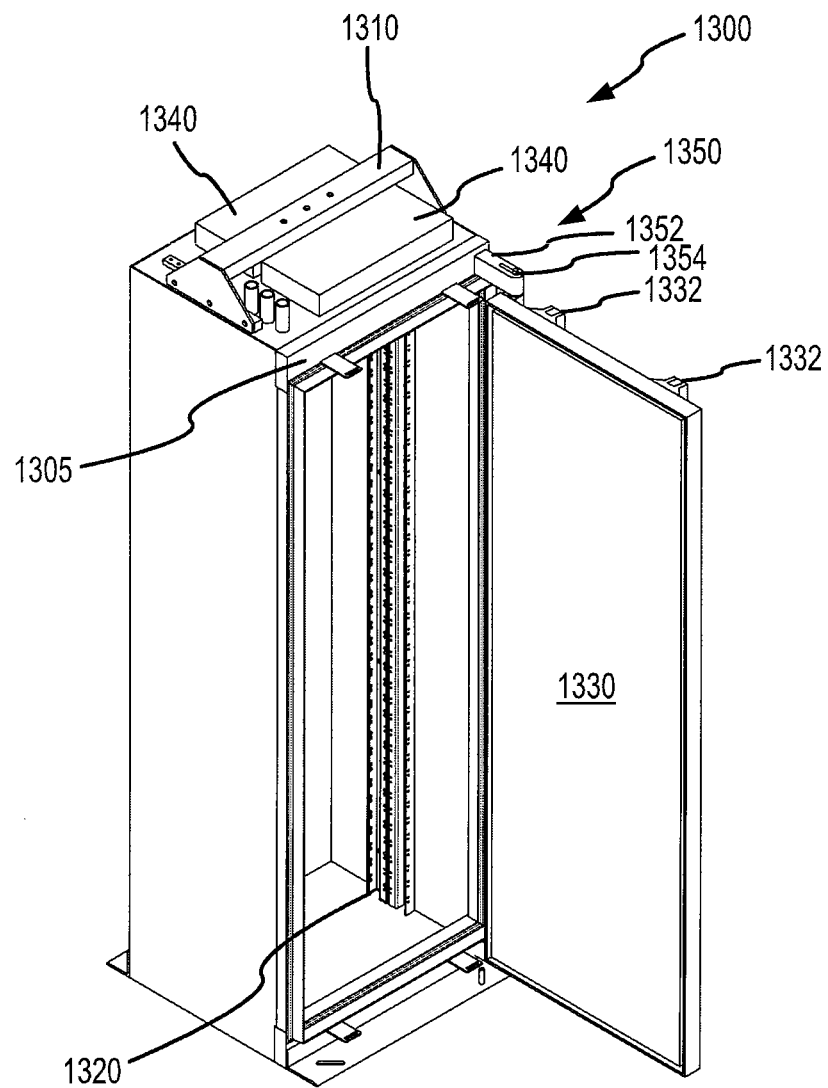
FIGS. 13A-13E illustrate an enclosure system having a sliding cantilever hinge design according to embodiments of the present invention.
Figure 13B:
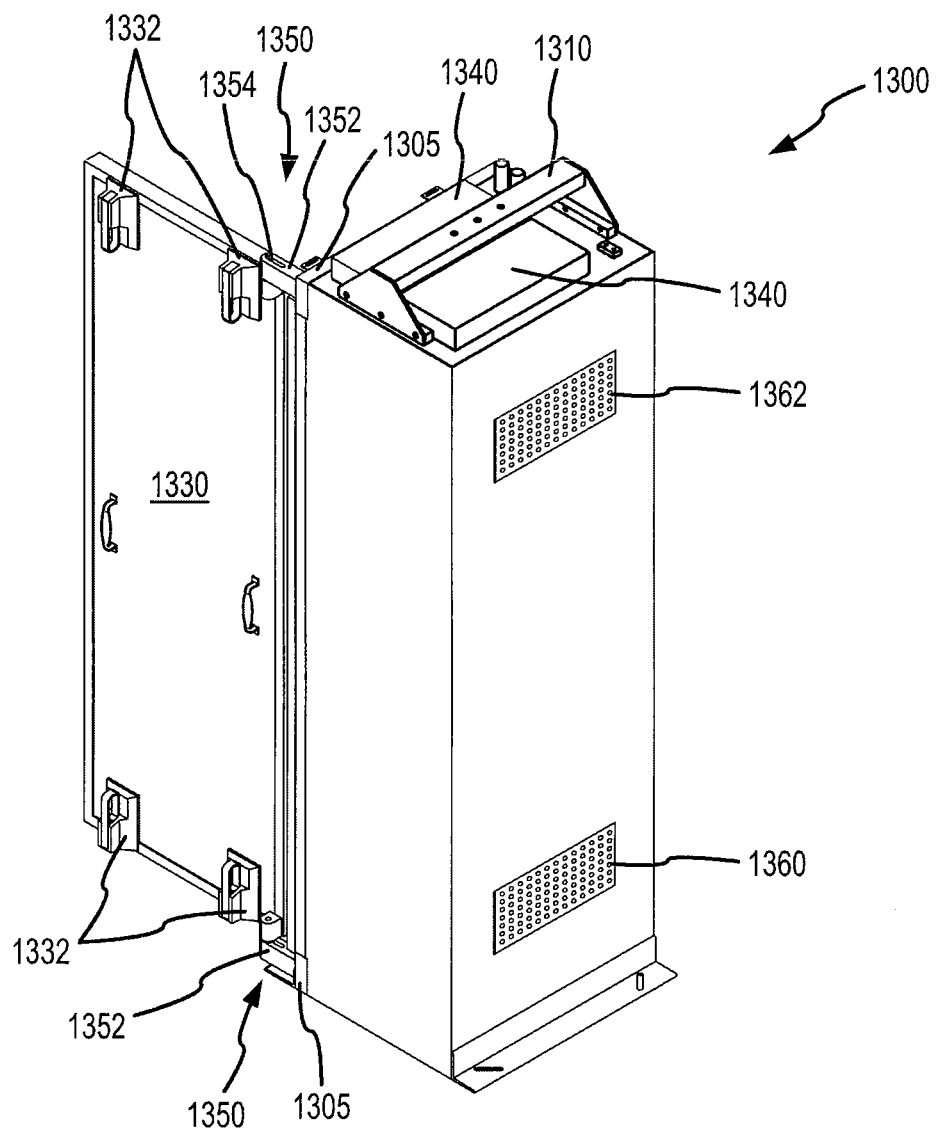
Figure 13C:
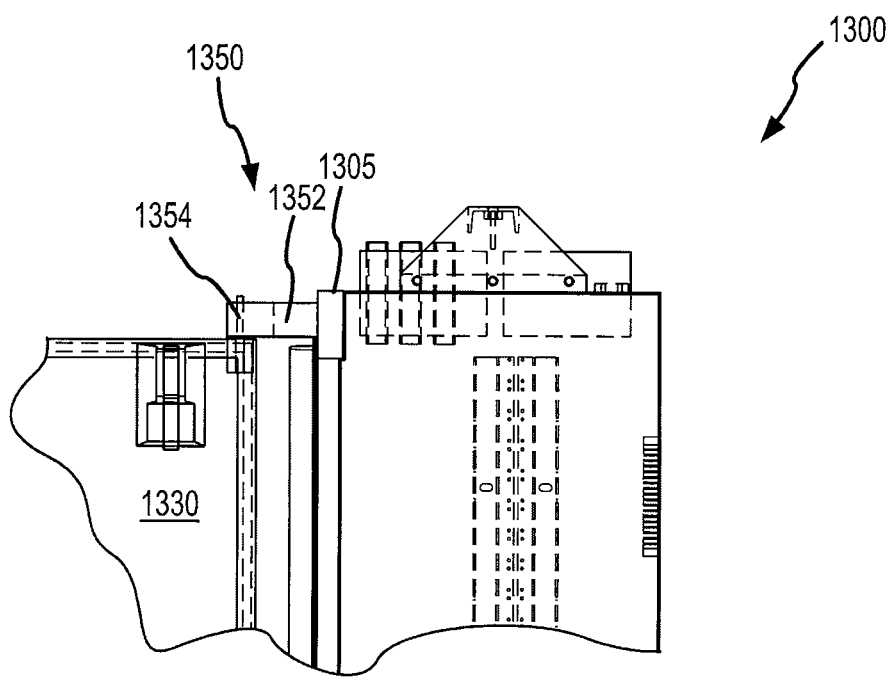
Figure 13D:
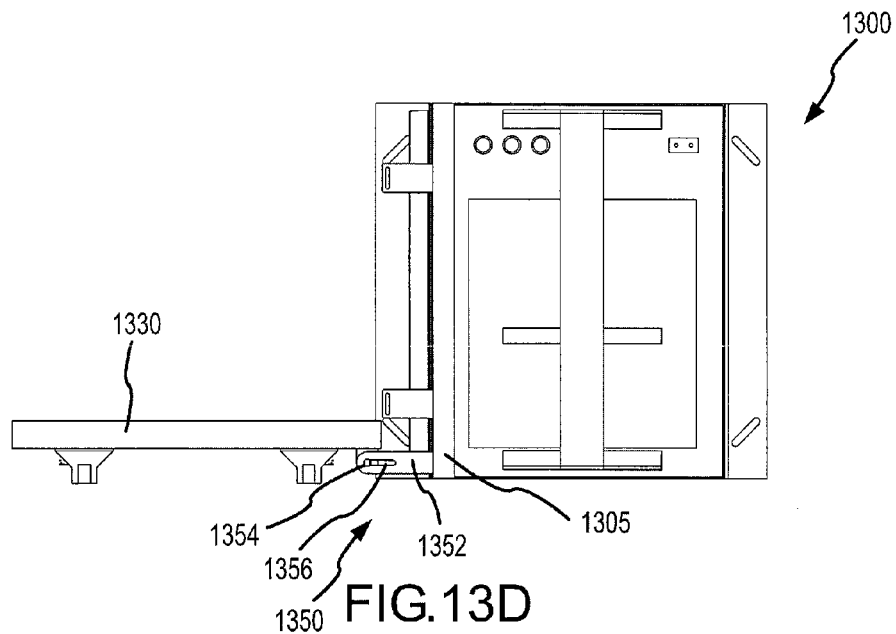
Figure 13E:
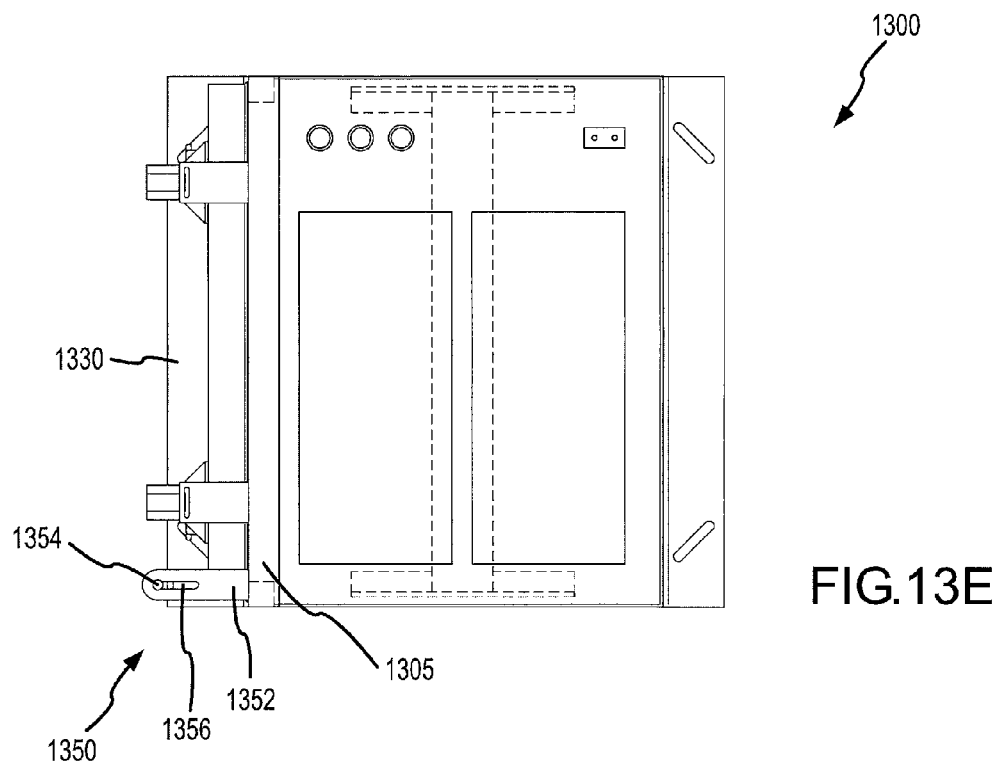

FIGS. 13A-13E illustrate an enclosure system 1300 having a sliding cantilever hinge design according to embodiments of the present invention. As shown in the front isometric view provided by FIG. 13A, enclosure system 1300 includes a seismic brace 1310, a rack channel and spacer assembly 1320, a door 1330, a plurality of door clamps 1332, a plurality of power filters 1340, a cantilever hinge assembly 1350. Cantilever hinge assembly 1350 includes a pin guide 1352 coupled with the body 1305 of the enclosure, and a pin 1354 coupled with the door 1330. As shown in the rear isometric view provided by FIG. 13B, enclosure system 1300 includes a seismic brace 1310, a door 1330, a plurality of door clamps 1332, a plurality of power filters 1340, a cantilever hinge assembly 1350, an intake vent 1360, and an exhaust vent 1362. Each cantilever hinge assembly 1350 includes a pin guide 1352 coupled with the body 1305 of the enclosure, and a pin 1354 coupled with the door 1330. FIG. 13C provides a partial side view (door open) of the enclosure system 1300. As seen here, the cantilever hinge assembly 1350 includes a pin guide 1352 coupled with the body 1305 of the enclosure, and a pin 1354 coupled with the door 1330. FIG. 13D provides a top view (door open) of the enclosure system 1300. As seen here, the cantilever hinge assembly 1350 includes a pin guide 1352 coupled with the body 1305 of the enclosure, and a pin 1354 coupled with the door 1330. Pin guide 1352 includes a pin guide aperture 1356 that is adapted to receive pin 1354. In use, pin 1354 is disposed within pin guide aperture 1356, and can slide or translate laterally within the aperture. FIG. 13E provides a top view (door closed) of the enclosure system 1300. As seen here, the cantilever hinge assembly 1350 includes a pin guide 1352 coupled with the body 1305 of the enclosure, and a pin 1354 coupled with the door 1330. Pin guide 1352 includes a pin guide aperture 1356 that is adapted to receive pin 1354. In use, pin 1354 is disposed within pin guide aperture 1356, and can slide or translate laterally within the aperture.

Enclosures according to embodiment of the present invention may include various accessories or features, including input and outputs such as cables and power cords, cutouts for connectors, LEDs, displays, ventilating slots, holes, or louvers in the top, back, or sides or provisions for mounting exhaust fans or blowers. Enclosures may also include wire management accessories such as cable management panels, clips, and cableway covers. Typically, the enclosure is hardened and is designed to shield from electromagnetic or radiofrequency interference. For example, the enclosure cabinet can be constructed of steel, which exhibits desirable shielding properties. Depending on the power level involved, points of entry into the enclosure can be protected from electromagnetic pulse by using specially-designed surge protectors.

Various testing protocols can be used to determine performance characteristics of an enclosure. For example, one testing protocol involves four suites of tests, including a heat testing dummy load suite, a heat testing functional equipment suite, a power system verification test suite, and an NEBS™ testing (empty cabinet only including fans and passive power filters) suite. A heat testing (dummy load equipment configuration) suite can determine whether a cabinet provides adequate or desired ventilation and temperature control characteristics in typical and borderline operating environments. An exemplary test involves simulating the heat production and power draw of a 60 amp system. Normal operating environment conditions can be tested within various locations of the cabinet (e.g. top, middle, and bottom). The test can determine whether the temperature stays within acceptable operating levels, and identify and measure any difference between the ambient temperature outside the cabinet and the internal cabinet temperature. Fan failures can be tested to identify and measure any effect on the internal temperature and the length of time it takes to reach steady state relative to the ambient temperature outside the cabinet. Such tests can involve disabling one or both of the cabinet fans, or the chassis fan. Airflow obstruction of external air intake vents can be tested, to determine any effect an obstruction (e.g. 50%) would have on the internal cabinet temperature over time. HVAC system failures can be tested inside a thermal chamber to determine any insulating properties the cabinet provides under a range of typical to extreme conditions that would impact the relative difference between external and internal temperature.

A heat testing (15 amp functional equipment configuration) suite can involve a specific equipment configuration that draws approximately 15 amps that is installed inside the cabinet. This suite can determine whether the cabinet provides adequate ventilation and temperature control in typical, borderline, and extreme operating environments when fully loaded with functioning equipment such as telecommunications equipment. This suite can also determine how the installed equipment performs in typical, borderline, and extreme operating environments. The test can determine whether the temperature stays within acceptable operating levels, and identify and measure any difference between the ambient temperature outside the cabinet and the internal cabinet temperature. Fan failures can be tested to identify and measure any effect on the internal temperature and the length of time it takes to reach steady state relative to the ambient temperature outside the cabinet. Such tests can involve disabling one or both of the cabinet fans, or the chassis fan. Airflow obstruction of external air intake vents can be tested, to determine any effect an obstruction (e.g. 50%) would have on the internal cabinet temperature over time. HVAC system failures can be tested inside a thermal chamber to determine any insulating properties the cabinet provides under a range of typical to extreme conditions, and the point at which the performance of the operating equipment begins to degrade.

A power system verification (on specific equipment configuration) suite can simulate a rapid site power failure to evaluate the operation of a converter and batteries, simulate a site power return to evaluate the operation of the converter, simulate a gradual drain of site batteries to evaluate the operation of the converter and batteries (e.g. by gradually reducing the input voltage), and simulate a site power return to evaluate the operation of the converter.

In a preferred embodiment, an enclosure meets the shielding requirements of MIL-STD-188-125-1, and has outside dimensions that do not exceed 26" wide, 84" tall, and 22⅜" deep. These measurements include the door, exterior mounted power line filters, and top seismic bracing, but not door handles, latches, air intake vent(s), or bottom bracing. The internal clear space depth is 19". The enclosure houses two battery strings (282.4 lbs per string), one battery switch (20-30 lbs), and combined functional electronic equipment (33 lbs). The enclosure has one front door entry having an opening of 23.5" to accommodate equipment installation and maintenance, a knife edge/copper finger stock EM door seal, and a hinge/latch/handle system that does not buckle, misalign, or degrade over approx 20 year life span when reasonably maintained. The enclosure also includes three shielded waveguide below cutoff fiber entry ports, located on the top of the cabinet, as far forward and to the left as possible, and below the top seismic bracing bar. The enclosure includes two shielded wave guide below cutoff air vents (and fan) that meet MIL-STD-188-125-1 requirements, are constructed of machined, steel material, ¾" thick with ⅛ inch holes for air flow, and are circumferentially welded per MIL HDBK 423 to the cabinet surface. The enclosure further includes a bottom vent, sized at 7"×16", and located 12" off the floor centered on the back wall of the cabinet, as well as a top vent with fan, sized 7"×16", centered on the back wall, 12" down from top of cabinet. The enclosure includes two −48 VDC exhaust fans capable of exhausting 320 CFM. Each fan is provided with 6" of hookup wire for both positive and negative terminals, and has access provisions for maintenance. The enclosure includes internal rails for equipment mounting. There is one rail system per side, each having a tapped front and back face. The forward rail face is located 8" into the cabinet (usable space), 11" from the back. The back rail face is located 5" from the front face. Opposite rails are located 21½" apart. Rails are tapped ½" (Typ) and 1¼" (Typ). Opposite mounting holes are be 22 5/16 apart. Holes are punched in a straight, vertical line for ease of equipment installation. Rails are strong enough to support zone 4 activity. A power system for the enclosure includes two 30 Amp 48 VDC, HEMP shielded power line filters, each filter is externally mounted on the top of the cabinet, removable for replacement and accessible for maintenance, includes two power inputs to accommodate two different power feeds (A/B) from site power, and is installed in accordance with MIL-HDBK 423 procedures. The power system also includes an external DC power connection to filter input that has four (4) power cables connected to the dirty power inputs on both filters, a specific cable type (# 6 power cable (6 AWG, XHHW, Black, Copper, Stranded, 1 Conductor, 600 Volt)), a specific cable length with approximately 4 feet of slack from the cabinet-delivered coiled. The cables enter the cabinet and are bonded to the power terminals of the "dirty" filter compartment. The power system further includes an internal power connection for filter output that has a pre-wired cable from filter output (which terminates inside the cabinet) that is run through a MIL-STD-188-125-1 compliant threaded and gasketed pipe nipple from the "clean" compartment of the power filter into the cabinet. The internal power connection also has a specific cable type (# 10 power cable) and a specific cable length with 5 feet of slack delivered coiled. What is more, the power system includes grounding that has a rectangular grounding strip (as apposed to a post), which is roughly 1" long, 2" wide and ½" thick. It is drilled with two ¼ inch holes (tapped for National Course-⅝" apart center to center), and is welded to the top rear of the cabinet. All items supporting power entry into and exit out of the filter are provided and pre-installed by the enclosure manufacturer. On-site power work involves "butt splicing" site power cables to the #6 cable protruding from the filter (work outside the cabinet) and terminating the # 10 power cable to the battery disconnect which feeds power to the distribution panel for the rest of the equipment (work inside the cabinet). The enclosure also includes a base mounting/support that has two solid flanges welded to the front and back of the cabinet, both running the entire width (26"). The support meets Zone 4 stress requirements, has elongated holes in each corner to accommodate floor anchoring bolts. The flanges are narrow but are still be able to accommodate installation of anchoring screws. The enclosure also includes a top seismic support, which has an auxiliary seismic bar structurally connected to the top of the cabinet to meet zone 4 requirements. The support runs parallel to the front and back, and includes (3) holes, three inches apart, tapped for ⅝" threaded rod. The support accommodates the power line filters and fiber POE mounted on the top of the cabinet. The enclosure batteries sit on two custom made trays (one on top of the other) at the bottom of the cabinet.

Acceptance testing of an enclosure can encompass a Shielding Effectiveness (SE) testing as well as E1 and E2 Pulse Current Injection (PCI) tests. The SE and PCI testing can be performed in accordance with MIL STD 188-125-1 Appendices A and B, respectively.

Acceptance Testing of Cabinet—Requirements Met

Figure 14:
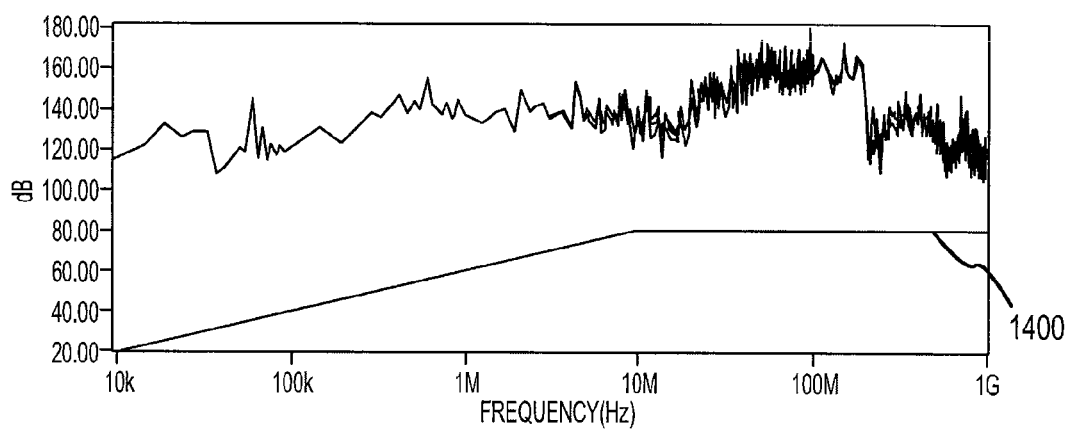
FIG. 14 shows the three measurement ranges of the system for the three Shielding Effectiveness tests.

In a first test example of an enclosure according to a preferred embodiment of the present invention, the cabinet shielding effectiveness of the enclosure exceeded the magnetic field (H) and electric field (E) performance requirements of the MIL-STD. The filters passed both E1 and E2 pulse current injection testing. The cabinet measured 84"

tall×26" wide×20" deep. The cabinet included two vertical supports on the left and right interior for mounting rack equipment. Two HEMP hardened filter boxes were mounted on the top exterior of the cabinet. For the SE test setup, free-space field maps for horizontal and vertical illumination of the cabinet door and sides as well as the roof were made with transmit and receive antennas separated by 1.6 m. The field maps were made with only the ground (earth) present. No metallic objects were nearby. For horizontal illumination of the sides of the cabinet, the receive antenna were rotated at 45 degrees relative to the transmit antenna in order to account for the receive antenna space limitations inside the cabinet under test. The field map for this horizontal configuration included this 45 degree rotation between transmit and receive antennas. For vertical illumination of the sides of the cabinet, the antennas were aligned as is specified in the MIL STD. No rotation off nominal antenna alignment was needed to accommodate fitting the receive antennas inside the cabinet. The field map was performed with the antennas aligned in an up and down configuration wherein the receive antennas were closest to the ground (earth), and the transmit antennas were above, and 1.6 meters away from, the receive antennas. This matched the antenna configuration used to test the roof of the cabinet. The SE measurement was made by subtracting the signal measured on the receive antennas inside the cabinet from the appropriate field map. The result, expressed in DB, is the Shielding Effectiveness. Magnetic field SE was measured from 10 kHz to 20 MHz. Electric field SE was measured from 20 MHz to 1 GHz. A determination of the system measurement range can be made based on the field maps and a noise floor measurement inside the cabinet. The measurement range can provide an upper bound on the shielding effectiveness that can be measured. FIG. 14 shows the three measurement ranges of the system for the three SE tests. Line 1400 represents the MIL-STD specification. This figure provides data for horizontal rotated 45 degree, vertical, and roof SE measurements for 1.6 m separation.

A fiber optic based broadband analog receiver can be used inside the cabinet to transmit the signal from the receive antennas back to a network analyzer where it is subsequently digitized and processed via computer. The cabinet can be equipped with a commercial fiber optic feedthrough consisting of a large cylindrical hole in the center of the feedthrough surrounded by a ring of smaller holes in which the fiber is placed in some current systems. It has been discovered that the diameter of the fiber is often be too large to be installed properly in the smaller holes of the feedthrough. Instead, the center plug of the feedthrough can be left out, and RF gasketing material can be placed around the fiber and filling the feedthrough hole. This plug can effectively reproduce the electrical performance of the original center plug. This configuration was maintained throughout SE and PCI testing.

Figure 15A:
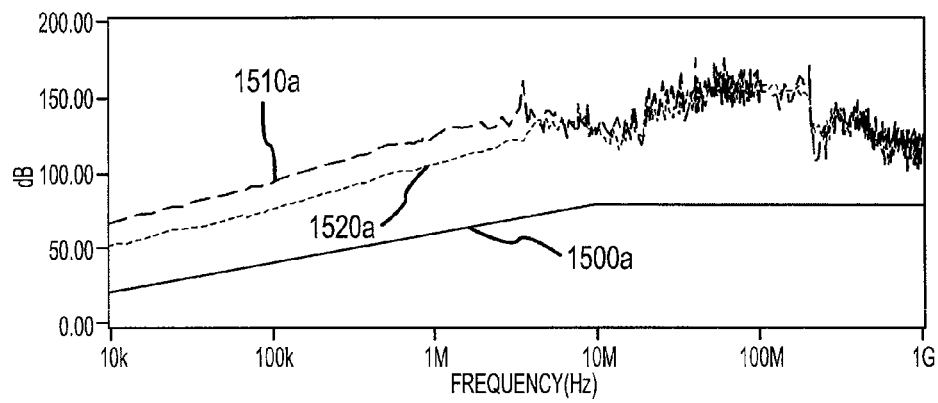
FIGS. 15A-15E show Shielding Effectiveness measurements of a cabinet according to embodiments of the present invention.
Figure 15B:
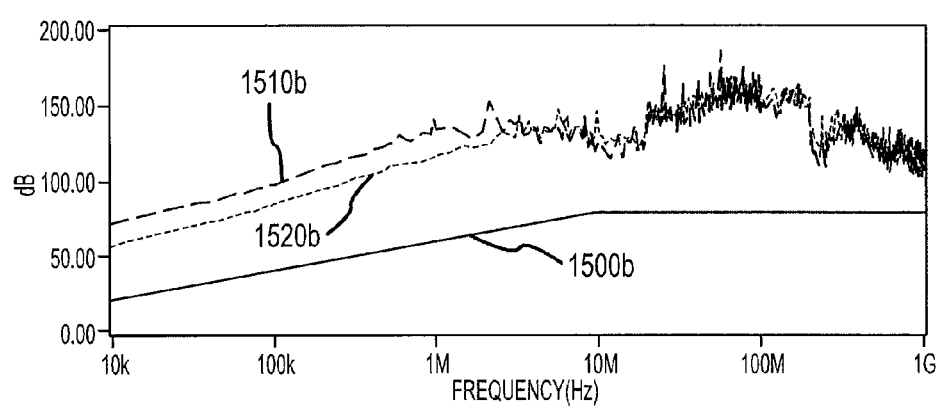
Figure 15C:
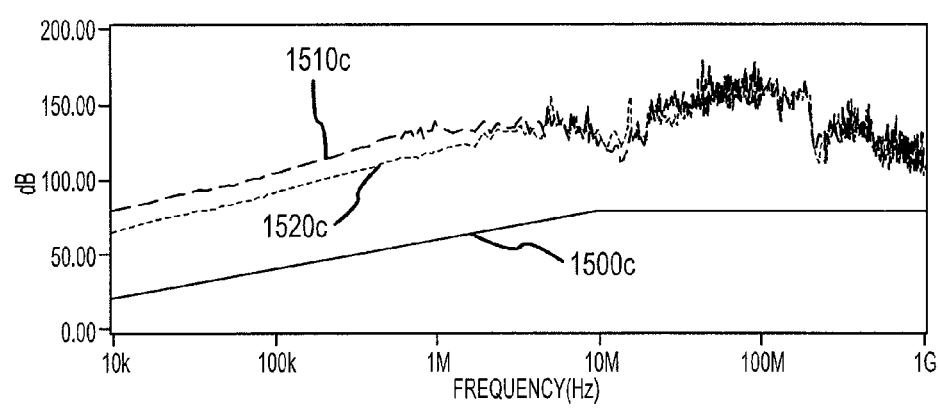
Figure 15D:
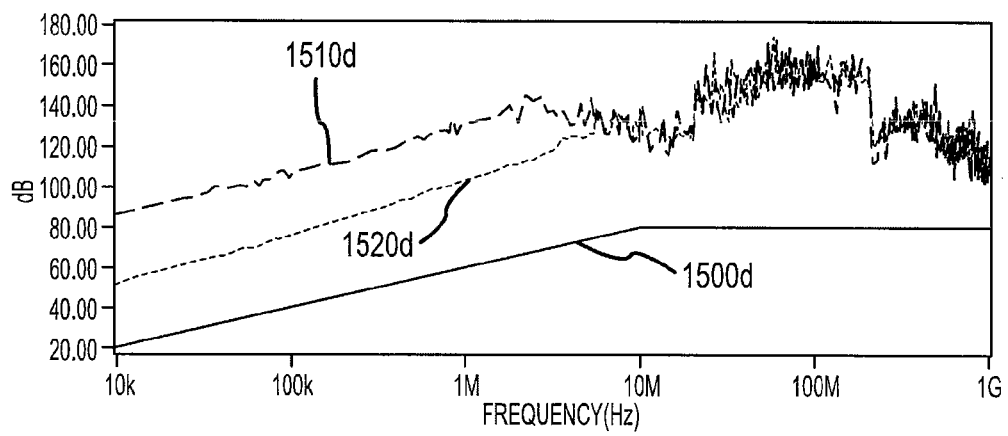
Figure 15E:
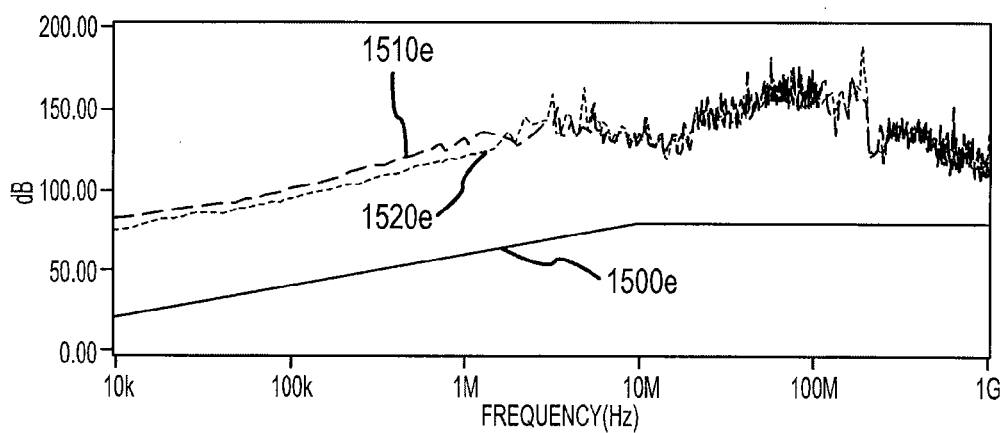

A total of 10 shielding effectiveness measurements of the cabinet were completed. The cabinet SE performance was found to exceed the requirements of MIL-STD-188-125-1 for all measurements. FIGS. 15A, 15B, 15C, and 15D show the horizontal and vertical SE for the cabinet door, left side, rear, and right side respectively (referenced when facing the door of the cabinet). In FIG. 15A, which shows horizontal and vertical SE measured on the cabinet door, line 1500a represents MIL-STD-188-125-1, line 1510a represents the horizontal SE, and line 1520a represents the vertical SE. In FIG. 15B, which shows horizontal and vertical SE measured on the cabinet left side, line 1500b represents MIL-STD-188-125-1, line 1510b represents the horizontal SE, and line 1520b represents the vertical SE. In FIG. 15C, which shows horizontal and vertical SE measured on the cabinet rear, line 1500c represents MIL-STD-188-125-1, line 1510c represents the horizontal SE, and line 1520c represents the vertical SE. In FIG. 15D, which shows horizontal and vertical SE measured on the cabinet right side, line 1500d represents MIL-STD-188-125-1, line 1510d represents the horizontal SE, and line 1520d represents the vertical SE. FIG. 15E shows the two orthogonal SE measurements of the roof. Line 1500e represents MIL-STD-188-125-1, line 1510e represents the roof 1 SE, and line 1520e represents the roof 2 SE. For the SE measurements shown in FIGS. 15A-15E, the data from a few MHz to 1 GHz is at or near the limit of the measurement range of the test system (shown in FIG. 14). Hence, the actual SE of the cabinet in this frequency range is equal to or greater than that shown in the data.

The filter PCI setup for this preferred enclosure cabinet embodiment includes four MPE DS33332C 250V 32 A HEMP protection filters. Each filter has an EPCOS B60K275 Metal Oxide Varistor (MOV) surge arrester protecting the front end. Pulse current injection (PCI) testing of the four filters involved injecting the filters/MOVs with the E1 and E2 current waveforms specified in MIL STD 188-125-1, and measuring the residual current waveform at the filter outputs into a dummy load as per Appendix B of the MIL STD. All PCI testing of the filters/MOVs was performed with no AC applied. Four drive current levels were used for both E1 and E2, with the fourth level being the full threat level dictated by the MIL-STD. For E1, the drive levels were approximately 70 A, 400 A, 1000 A, and 2500 A. For E2, the drive levels were approximately 3 A, 40 A, 10 A, and 250 A. Wire-to-ground tests were performed on the filters, and the filters were tested one at a time. The local ground on the input of the filter was used as the low side reference for the E1 and E2 pulse generators. For E1 testing the output of the filter under test was terminated in 2 Ohms to the cabinet itself. For E2 testing the output of the filter under test was terminated in 50 Ohms to the cabinet itself. This termination occurred inside the cabinet.

The residual output current into the 2 or 50 ohm load of the filter was measured using a Pearson inductive current probe, and the resulting voltage waveform out of the current probe was transmitted back to oscilloscopes for digitizing. For the E-1 PCI, this residual current probe signal was transmitted back via an analog fiber link; for the E-2 PCI, this signal was transmitted directly over coaxial cable. The drive signal for the E-1 PCI was measured with a derivative current probe (I-dot) which was transmitted back to the oscilloscope over an analog fiber optic link. The drive signal for the E-2 PCI was measured with a current probe which was transmitted back to the oscilloscope directly over coaxial cable. The digitized current signals (drive and residual) from the oscilloscope were corrected by the computer for effects of the current probe, fiber optic link, and any fixed attenuators used. The resulting time domain waveforms, corrected for instrumentation effects, are described below via an analog fiber link. A pulser can be connected to one of the two filters for testing at the 2500 amp E1 level.

The filter PCI test results can be described as follows. The filters under test are referenced from the front to rear relative to the door of the cabinet. Therefore, FF1 corresponds to the front filter, L1, FF2 corresponds to the front filter, L2, FR1 corresponds to the rear filter, L1, and FR2 corresponds to the rear filter, L2. In terms of surge arrester testing, standard testing procedures have the surge arrestor protecting the input to the filter tested before and after PCI to ensure no damage to the device has occurred. The EPCOS MOV surge arresters on each filter were tested using a Bourns Model 4010-01 Surge Protector Test Set. This tester supplies a triangular voltage waveform with a rate of rise of 200V per second and a peak voltage of 1000V. When 1 mA of current flow is detected, the tester reports the voltage at which this occurs. Problems with the tester precluded its use for pre-test measurements, but post-test measurements were completed successfully. To obtain a representative pre-test evaluation, a set of 4 identical MOV's was purchased and tested. The data from the untested sample and post-test results for the installed MOV's are shown in Table 2 below (EPCOS surge arrester pre-test and post-test performance).

TABLE 2

| Surge Arrester | Pre-Test Measurement (untested sample) | Post-Test Measurement |
|---|---|---|
| FR1 | 441 V | 446 V |
| FR2 | 442 V | 442 V |
| FF1 | 445 V | 441 V |
| FF2 | 442 V | 449 V |

Figure 16:
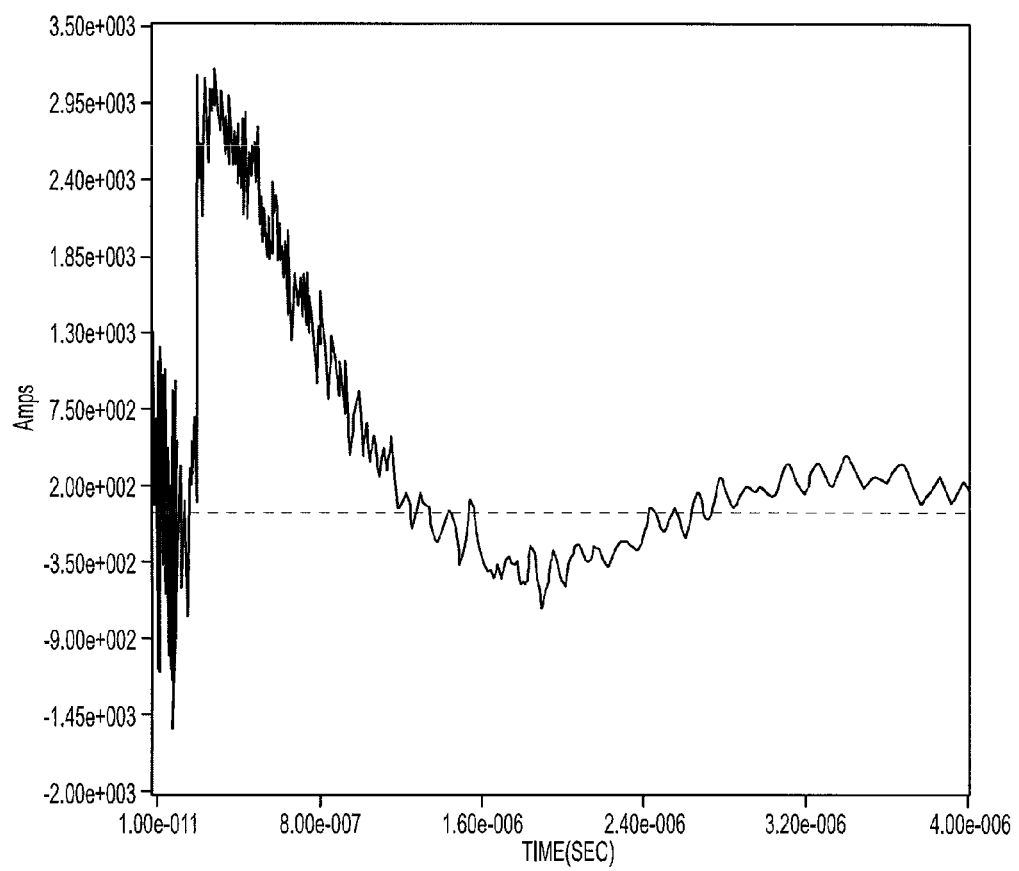
FIG. 16 shows a drive current waveform into a short circuit according to embodiments of the present invention.

In terms of E1 test results, the MIL STD 188-125-1 specified E1 risetime and Full Width Half Maximum (FWHM) values are <20 ns and 500-550 ns into a short circuit. FIG. 16 shows the drive current waveform into a short circuit. This waveform has a peak current of 3000 A. When driving the actual cabinet filter/MOV combination, the delivered peak current was typically 2500-2600 amps (spec is 2500 amps).

Figure 17:
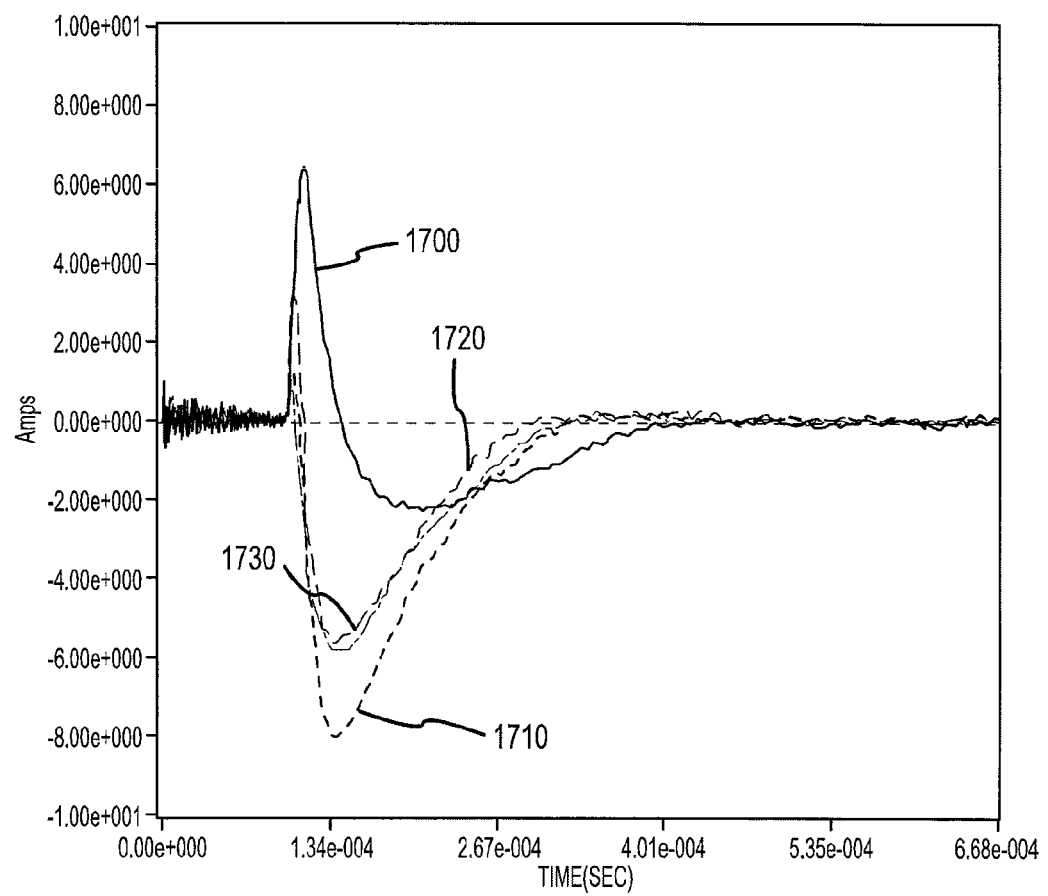
FIG. 17 shows residuals measured on filters for the peak drive currents according to embodiments of the present invention.

Mil-Std 188-125-1 residual current requirements are: less than 10 A for peak current, less than 1.0e+07 for peak rate of rise, and less than 1.6e−01 for root action. The MIL STD requires that all 3 of the norms be met. FIG. 17 shows the residuals measured on each of the four filters for the peak 2500 A drive currents. Line 1700 represents FR2, line 1710 represents FF2, line 1720 represents FF2, and line 1730 represents FR1. Table 3 shows that, for this preferred cabinet embodiment, the 4 filters met the required norms for each residual (E1 residual norms for 2500 A drive).

TABLE 3

| Filter | Peak Drive Current (A) | Peak Current (A) | Peak Rate of Root Action (A/s) | Root Action (A sqrt(s)) |
|---|---|---|---|---|
| FR1 | 2500 A | 5.56 | 8.05e+06 | 4.76e−02 |
| FR2 | 2500 A | 6.45 | 8.02e+06 | 3.39e−02 |
| FF1 | 2500 A | 5.78 | 4.57e+06 | 4.69e−02 |
| FF2 | 2500 A | 7.99 | 5.68e+06 | 6.49e−02 |

Figure 18:
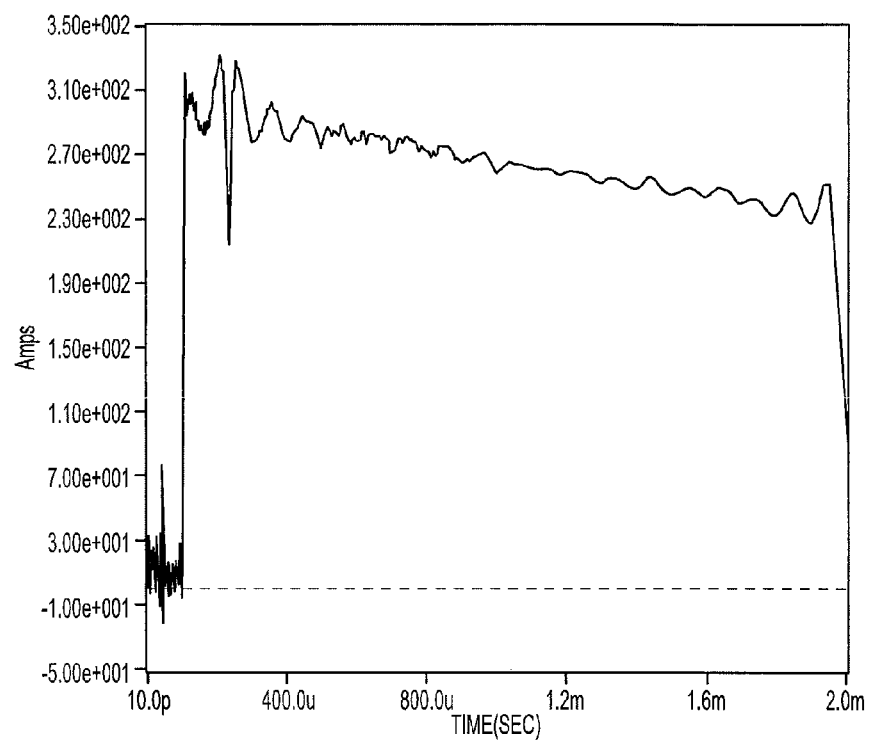
FIGS. 18 and 19 show details of an E2 risetime and entire waveform into a short circuit according to embodiments of the present invention.
Figure 19:
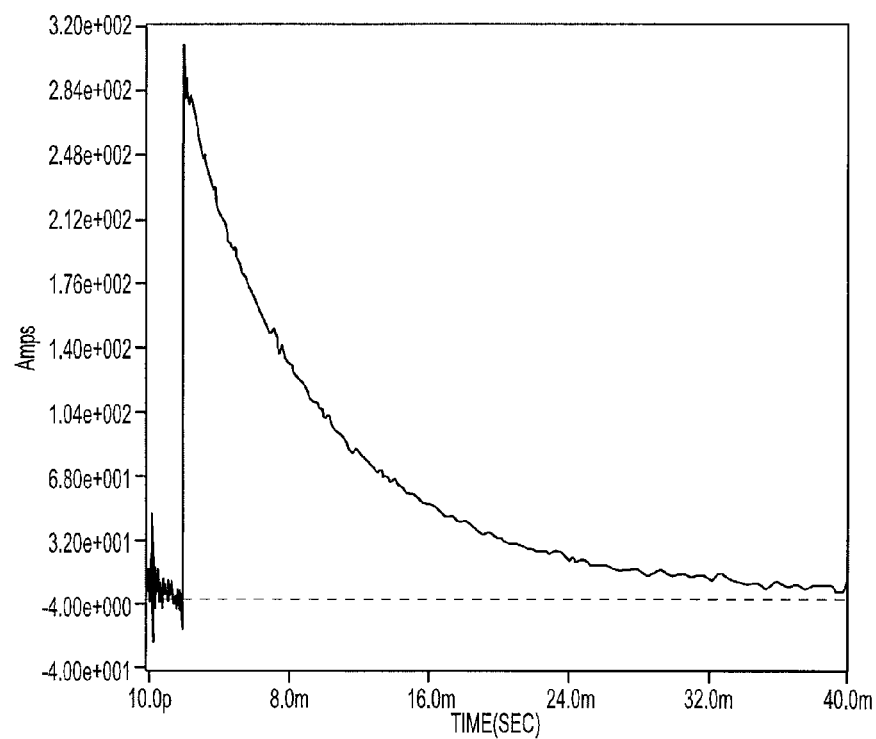

In terms of E2 test results, the MIL STD 188-125-1 specified E2 risetime and Full Width Half Maximum (FWHM) values are <1 us and 3 to 5 ms. It may be difficult to completely capture properly a waveform with such a fast risetime compared to its width on digital oscilloscope. FIGS. 18 and 19 show the details of the E2 risetime and entire waveform into a short circuit. FIG. 18 shows the risetime of E2 current pulse into short circuit. FIG. 19 shows the entire E2 current waveform into short circuit.

Figure 20:
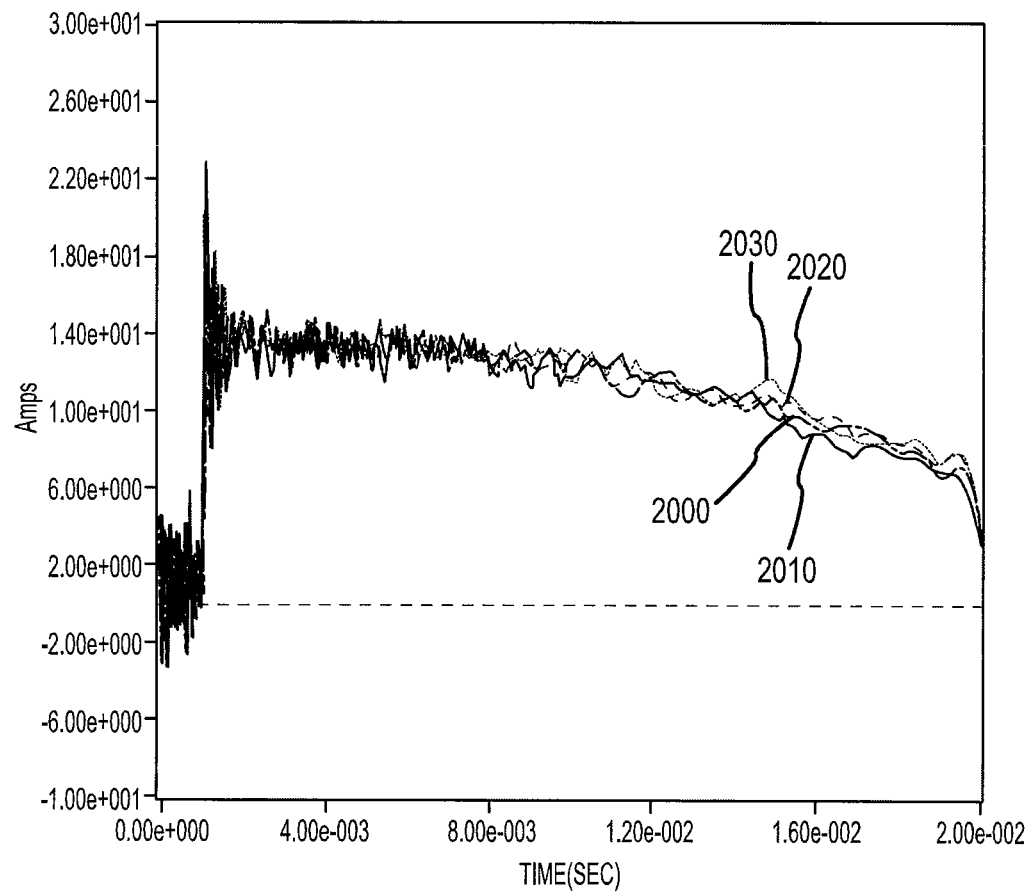
FIG. 20 depicts four recorded E2 residuals according to embodiments of the present invention.

Because MIL-STD-188-125-1 does not contain an explicit residual requirement for E2 current injection, the pass/fail criteria used for acceptance testing in one embodiment is that there be no damage or upset to the filter and its front end surge arrester. The four filters on this preferred cabinet embodiment met the pass requirements for E2 current injection. FIG. 20 shows the four recorded E2 residuals. Line 2000 represents FR2, line 2010 represents FF2, line 2020 represents FF2, and line 2030 represents FR1. The DSO sweep speed used for the figure was picked to allow a proper capture of the risetime and waveform peak, but only part of the waveform decay.

In sum, this preferred cabinet embodiment passed the MIL-STD-188-125-1 Appendix A and B Acceptance testing. Appendix A testing included horizontal and vertical measurements of shielding effectiveness on all four sides and the roof of the cabinet. Appendix B testing included E1 and E2 current waveforms injected into the filters at increasing amplitudes up to and including the 2500 A threat level for wire-to-ground for E1 and 250 A for E2.

Acceptance Testing of Cabinet—Requirements Not Met

The following description provides test results for a cabinet that did not meet certain accepting testing requirements. Testing included the Shielding Effectiveness (SE) as well as E1 and E2 Pulse Current Injection (PCI) tests. The SE and PCI testing were performed in accordance with MIL STD 188-125-1 Appendices A and B, respectively. The cabinet initially failed horizontal SE testing on all four sides. Also, both orthogonal SE measurements of the roof failed. An examination of the cabinet found that the door hinges were out of position. After the door was repositioned, the left side of the cabinet was re-tested. The horizontal SE was found to pass with only a few dB of margin. No further re-testing was performed. The filters passed both E1 and E2 pulse current injection testing.

The cabinet measured 84" tall×26" wide×20" deep. The cabinet included two vertical supports on the left and right interior for mounting rack equipment. There were two HEMP hardened filter boxes mounted on the top exterior of the cabinet, each containing two filters. The HEMP hardened side of these boxes feed directly into the cabinet. The cabinet included a hole drilled through it at the lower right corner of the cabinet left side. This hole had been installed to accommodate an RF-feedthrough used in testing prior to DTRA receiving the cabinet. This hole was sealed using a two fiat washers, two RF gaskets, and a nut and bolt. The gasket was placed on either side of the cabinet wall, covered with the washers, and tightened down with the nut and bolt.

Figure 21:
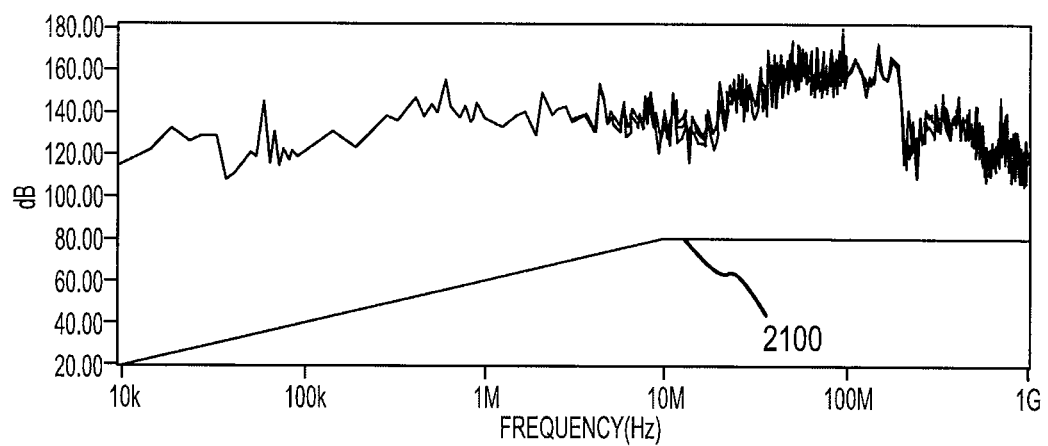
FIG. 21 shows three measurement ranges of a DTRA system for three Shielding Effectiveness tests according to embodiments of the present invention.

For the SE test setup, free-space field maps for horizontal and vertical illumination of the cabinet door and sides as well as the roof were made with transmit and receive antennas separated by 1.6 m. These field maps were made with only the ground (earth) present—no metallic objects were nearby. For horizontal illumination of the sides of the cabinet, the receive antenna needed to be rotated at 45 degrees relative to the transmit antenna in order to account for the receive antenna space limitations inside the cabinet under test. The field map for this horizontal configuration included this 45 degree rotation between transmit and receive antennas. For vertical illumination of the sides of the cabinet, the antennas were aligned as is specified in the MIL STD. No rotation off nominal antenna alignment was needed to accommodate fitting the receive antennas inside the cabinet. For the illumination of the roof of the cabinet, no rotation of the antennas was required. The field map, however, was performed with the antennas aligned in an up and down configuration wherein the receive antennas were closet to the ground (earth), and the transmit antennas were above, and 1.6 meters away from, the receive antennas. This matched the antenna configuration used to test the roof of the cabinet. An SE measurement was made by subtracting the signal measured on the receive antennas inside the cabinet from the appropriate field map. The result, expressed in DB is the Shielding Effectiveness. Magnetic field SE was measured from 10 kHz to 20 MHz. Electric filed SE was measured from 20 MHz to 1 GHz. Using these field maps, and using a noise floor measurement inside the cabinet, a determination of the system measurement range can be made. This measurement range provides an upper bound on the shielding effectiveness that can be measured. FIG. 21 shows the three measurement ranges of the DTRA system for the three SE tests (horizontal rotated 45 degrees, vertical, and roof SE measurement ranges for 1.6 m separation). Line 2100 represents the MIL-STD specification.

A fiber optic based broadband analog receiver is used inside the cabinet to transmit the signal from the receive antennas back to a network analyzer where it is subsequently digitized and processed via computer. The cabinet was equipped with a commercial fiber optic feedthrough consisting of a large cylindrical hole in the center of the feedthrough surrounded by a ring of smaller holes in which the fiber is currently placed in some systems. The diameter of the fiber was found to be too large to be installed properly in the smaller holes of the feedthrough and still allow the center plug to be completely installed. Instead, the center plug of the feed through was inserted as far as possible, and RF gasketing material was placed around the fiber and filling the rest of the feedthrough hole. A metal cap was fabricated and installed which further capped these holes on the exterior of the cabinet. This plug effectively reproduced the electrical performance of the original center plug. This configuration was maintained throughout SE and PCI testing.

In terms of SE test results, during initial SE testing of this cabinet, the horizontal SE measurements were found to fail at the high frequency end of the test spectrum for all four sides. An examination of the cabinet found that the hinges holding the door on the cabinet had worked loose. Eight shielding effectiveness measurements of this cabinet were completed on the four sides, four horizontal and vertical, as well as the two orthogonal measurements of the roof, prior to correcting the hinge problem. After correction, a horizontal SE measurement of the left side of the cabinet was repeated, and the cabinet was found to pass with only a few dB of margin. No other SE re-tests were performed.

Figure 22A:
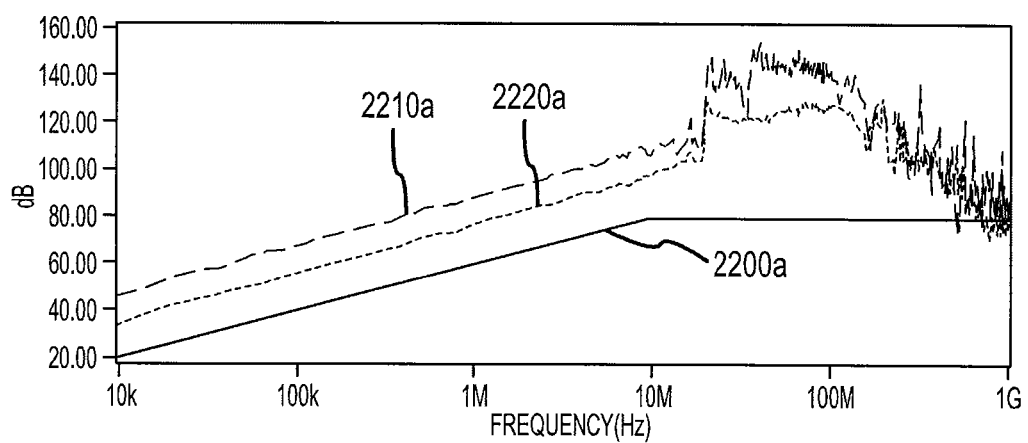
FIGS. 22A-22E show Shielding Effectiveness measurements of a cabinet according to embodiments of the present invention.
Figure 22B:
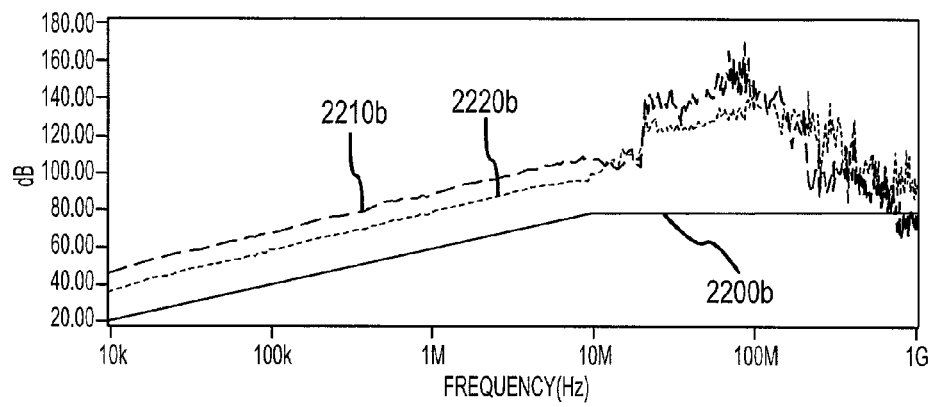
Figure 22C:
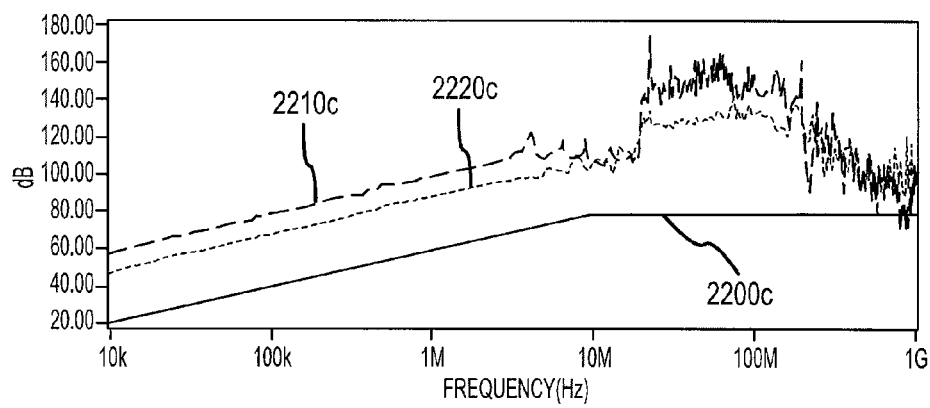
Figure 22D:
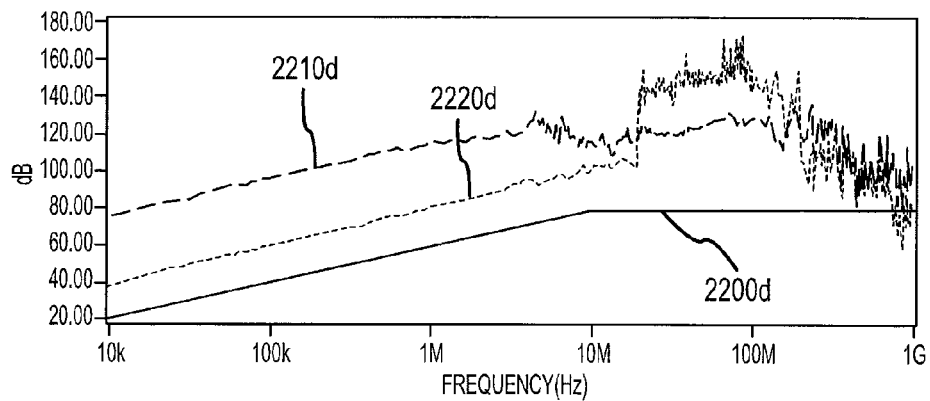
Figure 22E:
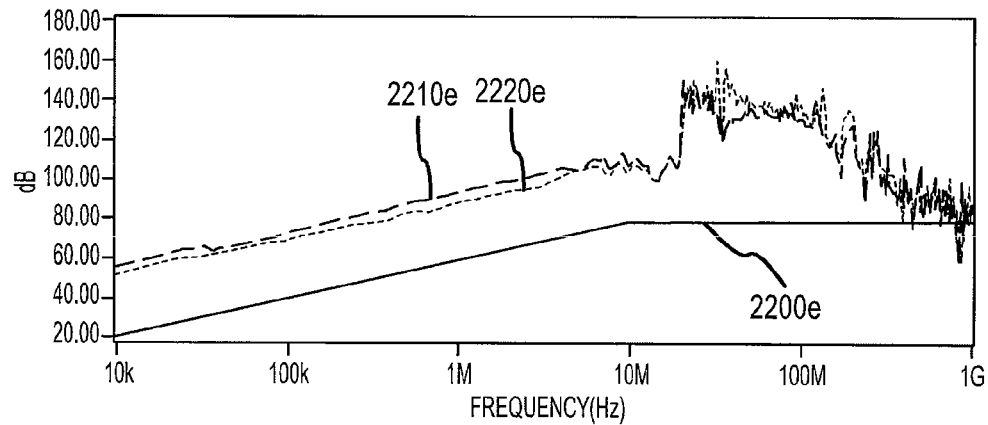

FIGS. 22A, 22B, 22C, and 22D show the horizontal and vertical SE for the cabinet door, left side, rear, and right side respectively, before the door was repaired. In FIG. 22A, which shows horizontal and vertical SE measured on the cabinet door, line 2200a represents MIL-STD-188-125-1, line 2210a represents the horizontal SE, and line 2220a represents the vertical SE. In FIG. 22B, which shows horizontal and vertical SE measured on the cabinet left side, line 2200b represents MIL-STD-188-125-1, line 2210b represents the horizontal SE, and line 2220b represents the vertical SE. In FIG. 22C, which shows horizontal and vertical SE measured on the cabinet rear, line 2200c represents MIL-STD-188-125-1, line 2210c represents the horizontal SE, and line 2220c represents the vertical SE. In FIG. 22D, which shows horizontal and vertical SE measured on the cabinet right side, line 2200d represents MIL-STD-188-125-1, line 2210d represents the horizontal SE, and line 2220d represents the vertical SE. FIG. 22E shows the two orthogonal SE measurements of the roof. Line 2200e represents MIL-STD-188-125-1, line 2210e represents the roof 1 SE, and line 2220e represents the roof 2 SE. Some of the SE measurements at the higher frequencies, as shown in FIGS. 22A-22E, can be seen to be essentially at the limit of the measurement range of the test system (shown in FIG. 21). This means that the actual SE of the cabinet at these frequencies is equal to or greater than that shown in the data.

Figure 23:
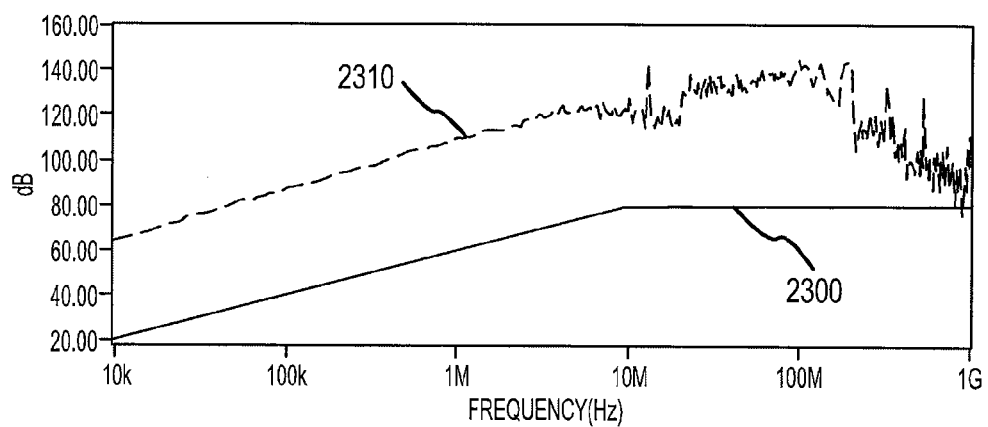
FIG. 23 illustrates results of a Shielding Effectiveness measurement according to embodiments of the present invention.

After completion of the original SE test measurement set, the door was realigned on the cabinet. Testing was performed on the cabinet with the repaired door. The left side of the cabinet was chosen for re-test since in the original data this side represented the worst failure. FIG. 23 shows the results of the post-door fix horizontal SE measurement. Line 2300 represents MIL-STD-188-125-1, and line 2310 represents the horizontal SE. As can be seen when compared to FIG. 22B there is improvement in SE across the entire frequency test range.

For the filter PCI test setup, this cabinet has four MPE DS33332C 250V 32A HEMP protection filters. Each filter has an EPCOS 1360K275 Metal Oxide Varistor (MOV) surge arrester protecting the front end. Pulse current injection (PCI) testing of the four filters involved injecting the filters/MOVs with the E1 and E2 current waveforms specified in MIL STD 188-125-1, and measuring the residual current waveform at the filter outputs into a dummy load as per Appendix B of the MIL STD. All PCI testing of the filters/MOVs was performed with no AC applied. Four drive current levels were used for both E1 and E2, with the fourth level being the full threat level dictated by the MIL-STD. For E1, the drive levels were approximately 70 A, 400 A, 1000 A, and 2500 A. For E2, the drive levels were approximately 3 A, 40 A, 10 A, and 250 A. Only wire-to-ground tests were performed on the filters, and the filters were tested one at a time. The local ground on the input of the filter was used as the low side reference for the E1 and E2 pulse generators. For E1 testing each filter was terminated in 2 Ohms to the cabinet itself. For E2 testing each filter was terminated in 50 Ohms, also to the cabinet itself. This termination occurs inside the cabinet. The residual output current into the 2 or 50 ohm load of the filter was measured using a Pearson inductive current probe, and the resulting voltage waveform out of the current probe was transmitted back to oscilloscopes for digitizing. For the E-1 PCI, this residual current probe signal was transmitted back via an analog fiber link; for the E-2 PCI, this signal was transmitted directly over coaxial cable. The drive signal for the E-1 PCI was measured with a derivative current probe (I-dot) which was transmitted back to the oscilloscope over an analog fiber optic link. The drive signal for the E-2 PCI was measured with a current probe which was transmitted back to the oscilloscope directly over coaxial cable. The digitized current signals (drive and residual) from the oscilloscope were corrected by the computer for effects of the current probe, fiber optic link, and any fixed attenuators used. The resulting time domain waveforms, corrected for instrumentation effects, are shown in Section, 6.2. via an analog fiber link. FIG. 11 below shows the pulser connected to one of the two filters for testing.

In terms of the filter PCI test results, the filters under test are referenced from the left to right relative to the door of the cabinet. Therefore, FLU corresponds to the left filter, L1, FLL2 corresponds to the left filter, L2, FRL1 corresponds to the right filter, L1, and FRL2 corresponds to the right filter, L2. For the surge arrester testing, standard testing procedures have the surge arrestor protecting the input to the filter tested before and after PCI to ensure no damage to the device has occurred. The EPCOS MOV surge arresters on each filter were tested using a Bourns Model 4010-01 Surge Protector Test Set. This tester supplies a triangular voltage waveform with a rate of rise of 200V per second and a peak voltage of 1000V. When 1 mA of current flow is detected, the tester reports the voltage at which this occurs. These 4 MOVs were tested before injection of the E-2 pulses and again after injection of the E-1 pulses. For comparison, a set of 4 identical MOV's was purchased and tested for their breakdown voltage (these MOVs were not pulsed). The data from the un-pulsed samples, the pre-E2 test results, and post E-2 test results for the installed. MOV's are shown in Table 4 below (EPCOS surge arrester pre-test and post-test performance compared to untested MOVs).

TABLE 4

| Surge Arrester | Pre-Test Measurement (untested sample) | Pre-E2 Test Measurement | Post-E2 Test Measurement |
|---|---|---|---|
| FLL1 | 441 V | 438 V | 446 V |
| FLL2 | 442 V | 433 V | 440 V |
| FRL1 | 445 V | 440 V | 446 V |
| FRL2 | 442 V | 422 V | 428 V |

Figure 24:
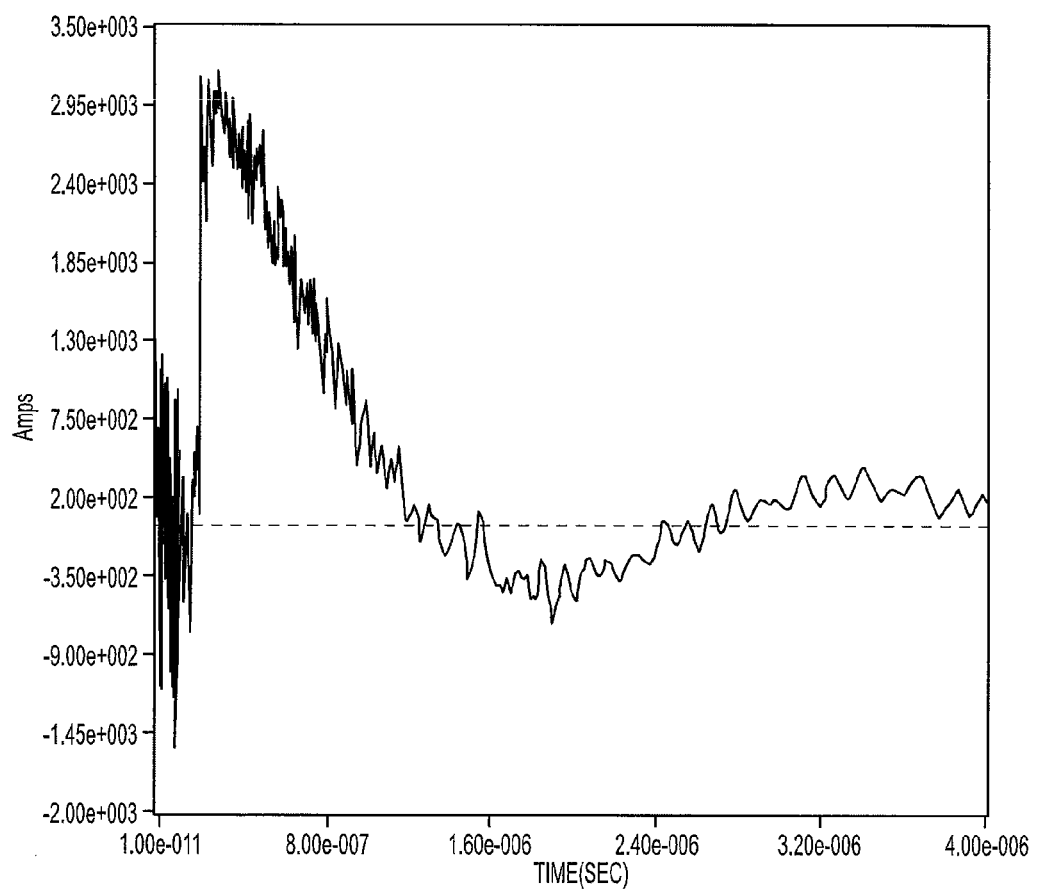
FIGS. 24 and 25 show residuals measured on filters for the peak drive currents according to embodiments of the present invention.
Figure 25:
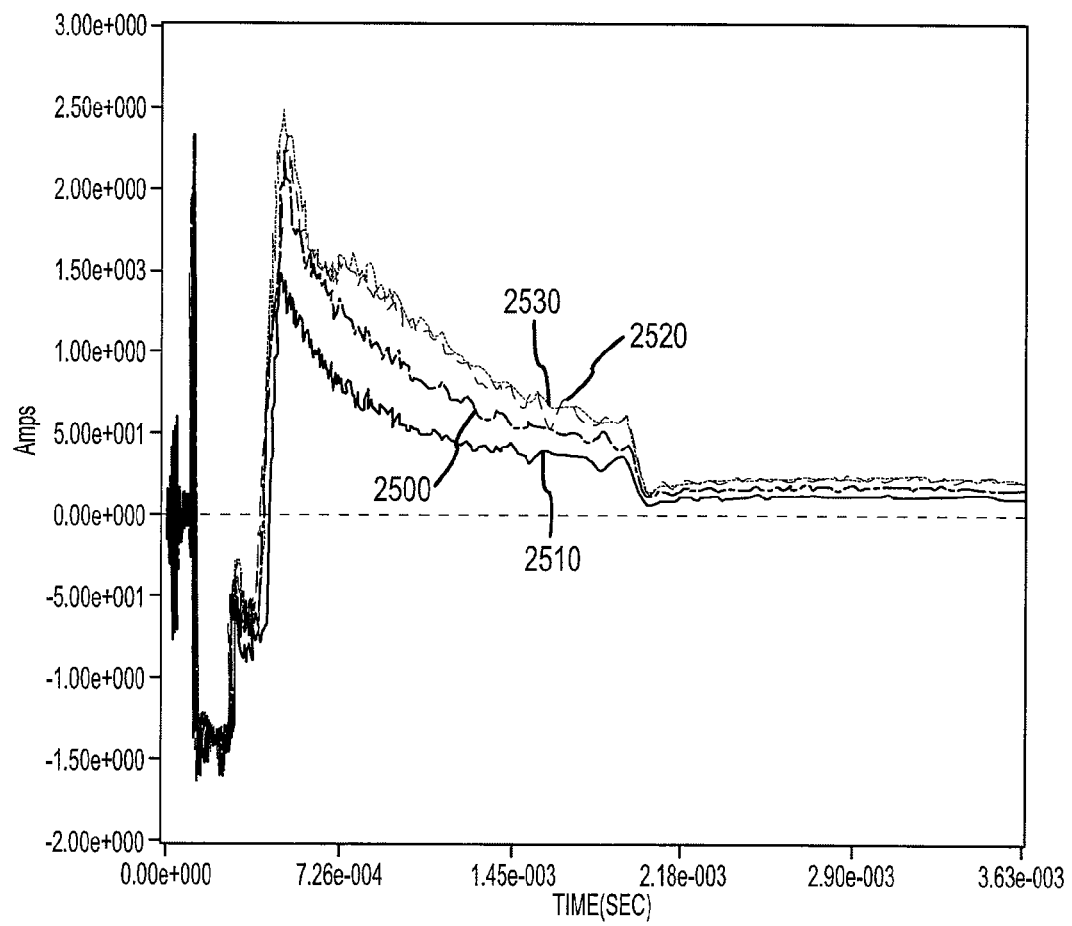

For the E1 test results, the MIL STD 188-125-1 specified E1 risetime and Full Width Half Maximum (FWHM) values are <20 ns and 500-550 ns into a short circuit. FIG. 24 shows the E1 drive current waveform into a short circuit. This waveform has a peak current of 3000 A. When driving the actual filter/MOV combination of this cabinet, the delivered peak current was typically 2500-2600 amps (spec is 2500 amps). MIL-STD-188-125-1 residual current requirements are: less than 10 A peak current, less than 1.0e+07 for peak rate of rise, and less than 1.6e−01 for root action. The MIL STD requires that all 3 of the norms be met. FIG. 24 shows the residuals measured on each of the four filters for the peak 2500 A drive currents. Table 5 shows that all 4 filters met all of the required norms for each residual. FIG. 25 shows the residuals measured on each of the four filters for the peak 2500 A drive currents. Line 2500 represents FRL2, line 2510 represents FLL2, line 2520 represents FRL1, and line 2530 represents FLL1. Table 5 shows the norms for each residual (E1 residual norms for 2500 A drive). The spec requirements are less than 10 A for peak current, less than 1.0e+07 for peak rate of rise, and less than 1.6e−01 for root action.

TABLE 5

| Filter | Peak Drive Current (A) | Peak Current (A) | Peak Rate of Rise (A/s) | Root Action (A sqrt(s)) |
|---|---|---|---|---|
| FLL1 | 2500 A | 2.49 | 9.63e+05 | 5.44e−02 |
| FLL2 | 2500 A | 2.35 | 1.13e+06 | 3.40e−02 |
| FRL1 | 2500 A | 2.36 | 1.16e+06 | 5.25e−02 |
| FRL2 | 2500 A | 2.12 | 1.40e+06 | 4.53e−02 |

Figure 26:
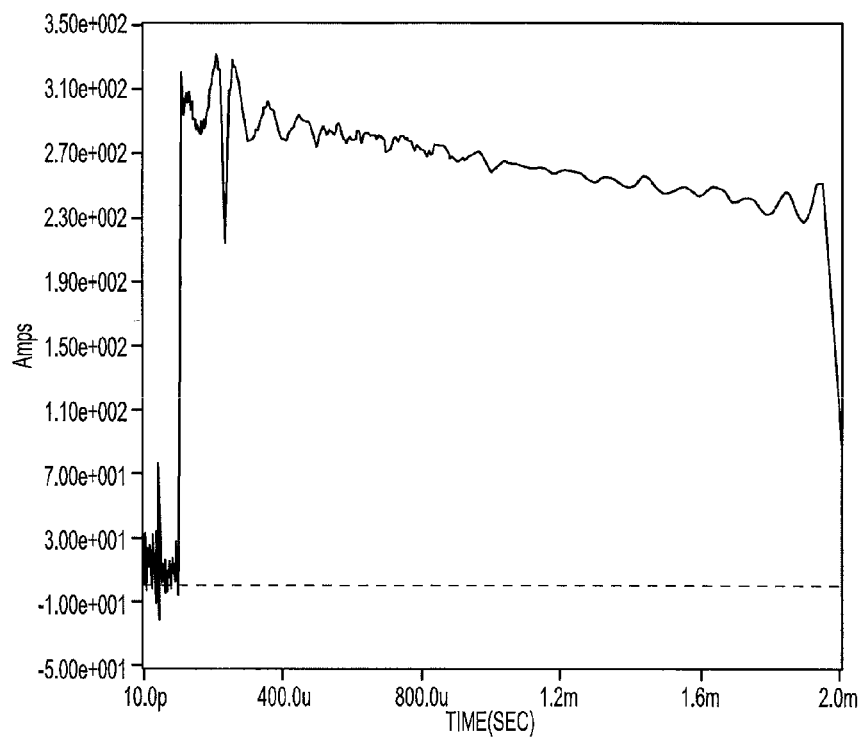
FIGS. 26 and 27 show details of an E2 risetime and entire waveform into a short circuit according to embodiments of the present invention.
Figure 27:
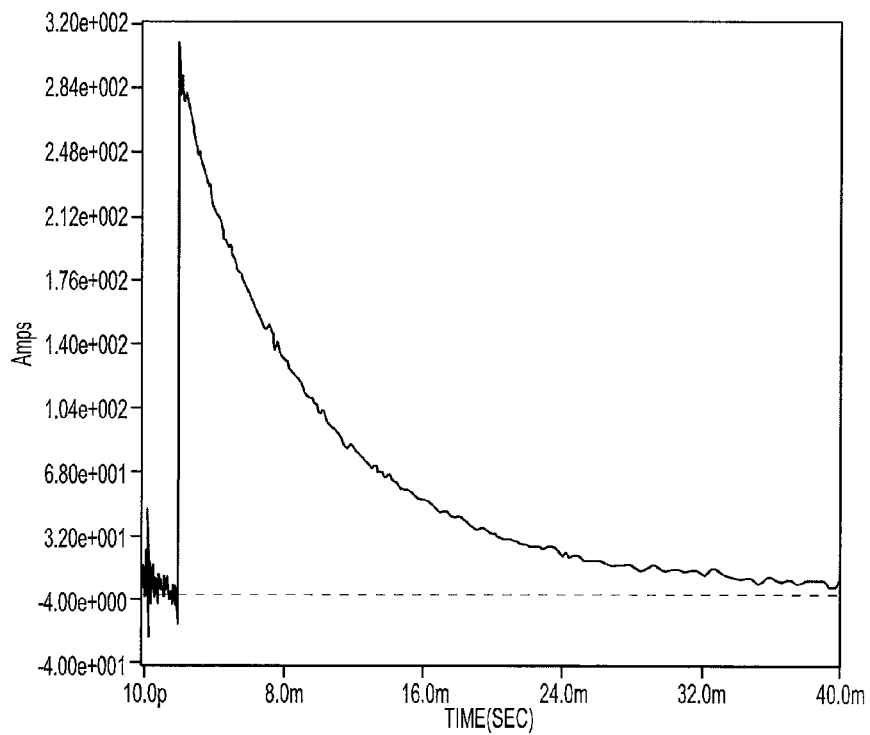

For the E2 test results, the MIL STD 188-125-1 specified E2 risetime and Full Width Half Maximum (FWHM) values are <1 us and 3 to 5 ms. It may be difficult to completely capture properly a waveform with such a fast risetime compared to its width on digital oscilloscope. FIGS. 26 and 27 show the details of the E2 risetime and entire waveform into a short circuit. FIG. 26 shows the risetime of E2 current pulse into short circuit. FIG. 27 shows the entire E2 current waveform into short circuit.

Figure 28:
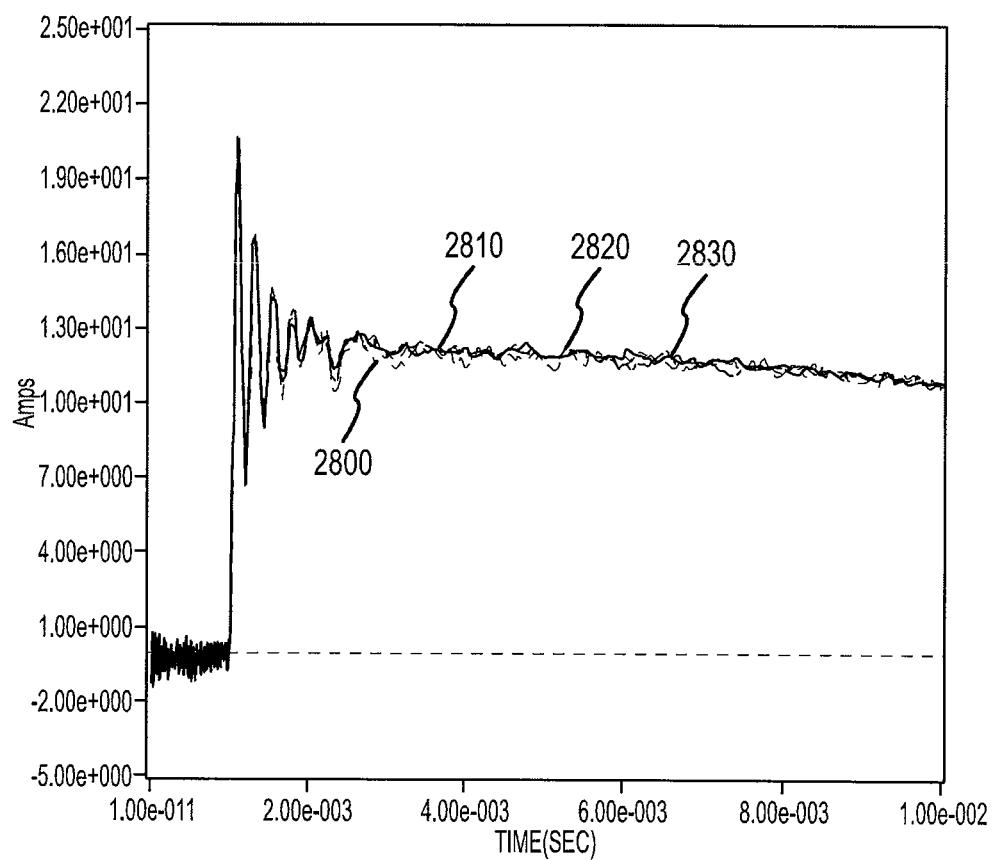
FIG. 28 shows recorded E2 residuals according to embodiments of the present invention.

Because MIL-STD-188-125-1 does not contain an explicit residual requirement for E2 current injection, the pass/fail criteria used for acceptance testing in one embodiment is that there be no damage or upset to the filter and its front end surge arrester. The four filters on this cabinet met the pass requirements for E2 current injection. FIG. 28 shows the four recorded E2 residuals (for 250 A drive). The DSO sweep speed used for the figure was picked to allow a proper capture of the risetime and waveform peak, but only part of the waveform decay. Line 2800 represents FRL2, line 2810 represents FRL1, line 2820 represents FLL2, and line 2830 represents FLL1.

In sum, this cabinet only marginally meets the performance requirements of MILSTD-188-125-1. As delivered, the cabinet failed the shielding effectiveness tests at the high end of the frequency band. With adjustment to the door, the worst SE measurement was repeated and found to barely meet the requirements of the standard. The filters met the PCI requirements of the standard, but due to the residual acceptance may not be warranted. The root cause of the failure of the cabinet seems to reside with the design of the door and its method of attachment to the cabinet. Without significant redesign of the RF contact around the door it may not be possible for this design to deliver a −20 dB or greater margin above the specification.

Although certain system, device, and method embodiments have been disclosed herein, it will be apparent from the foregoing disclosure to those skilled in the art that variations, modifications, alternative constructions, and equivalents of such embodiments may be made without departing from the true spirit and scope of the invention. Therefore, the above description should not be taken as limiting the scope of the invention which is defined by the appended claims.

What is claimed is:

1. A HEMP protected enclosure for holding an electronic device, comprising:
    a cabinet having an interior space; and
    a rack disposed within the interior space, the rack configured to support the electronic device;
    wherein the cabinet comprises a maximum width dimension that does not exceed about 26 inches and a maximum depth dimension that does not exceed about 22⅜ inches, and the enclosure provides a HEMP protection level to the telecommunications device that meets a HEMP protection level according to MIL-STD-188-125-1.

2. A HEMP protected telecommunications enclosure as in claim 1, wherein the cabinet comprises a maximum height dimension that does not exceed about 84 inches.

3. A HEMP protected telecommunications enclosure as in claim 1, wherein the enclosure provides a HEMP protection level to the telecommunications device of at least 100 dB attenuation at 1 GHz.

4. A HEMP protected telecommunications enclosure as in claim 1, further comprising:
    a power input point of entry that facilitates entry of a power cable to the interior space from a location external to the cabinet; and
    a fiber optic cable point of entry that facilitates entry of a fiber optic cable to the interior space from a location external to the cabinet.

5. A HEMP protected telecommunications enclosure as in claim 1, further comprising:
    a converter; and
    a battery coupled with the converter.

6. A HEMP protected telecommunications enclosure as in claim 1, further comprising a power filter.

7. A HEMP protected telecommunications enclosure as in claim 6, wherein a clean output of the power filter is disposed within the interior space of the cabinet.

8. A HEMP protected telecommunications enclosure as in claim 6, wherein a dirty input of the power filter is disposed external to the cabinet.

9. A HEMP protected telecommunications enclosure as in claim 1, wherein the enclosure provides a HEMP protection level to the telecommunications device of at least 80 dB attenuation at 1 GHz.

10. A HEMP protected telecommunications enclosure as in claim 1, further comprising:
    a power input point of entry that facilitates entry of a power cable to the interior space from a location external to the cabinet, the power input point of entry disposed at a top surface of the enclosure; and
    a fiber optic cable point of entry that facilitates entry of a fiber optic cable to the interior space from a location external to the cabinet, the fiber optic cable point of entry disposed at a top surface of the enclosure.

11. A HEMP protected telecommunications enclosure as in claim 10, comprising a power cable coupled with the power input point of entry, and a fiber optic cable coupled with the fiber optic cable point of entry.

\* \* \* \* \*